United States Patent
Mark et al.

(10) Patent No.: US 9,694,544 B2
(45) Date of Patent: Jul. 4, 2017

(54) METHODS FOR FIBER REINFORCED ADDITIVE MANUFACTURING

(71) Applicant: MarkForged, Inc., Somerville, MA (US)

(72) Inventors: Gregory Thomas Mark, Cambridge, MA (US); David Benhaim, Cambridge, MA (US); Abraham Parangi, Lincoln, MA (US); Benjamin Sklaroff, Somerville, MA (US)

(73) Assignee: MARKFORGED, INC., Cambridge, MA (US)

( * ) Notice: Subject to any disclaimer, the term of this patent is extended or adjusted under 35 U.S.C. 154(b) by 97 days.

(21) Appl. No.: 14/491,439

(22) Filed: Sep. 19, 2014

(65) Prior Publication Data

US 2015/0165691 A1    Jun. 18, 2015

Related U.S. Application Data

(63) Continuation-in-part of application No. 14/297,437, filed on Jun. 5, 2014, now Pat. No. 9,370,896, and a
(Continued)

(51) Int. Cl.
| | |
|---|---|
| B29C 67/00 | (2017.01) |
| G05B 15/02 | (2006.01) |
| G06F 17/50 | (2006.01) |
| B29C 70/16 | (2006.01) |
| B33Y 10/00 | (2015.01) |
| B33Y 50/02 | (2015.01) |
| B29K 63/00 | (2006.01) |
| B29K 71/00 | (2006.01) |
| B29K 77/00 | (2006.01) |
| B29K 79/00 | (2006.01) |
| B29K 25/00 | (2006.01) |

(52) U.S. Cl.
CPC ...... *B29C 67/0088* (2013.01); *B29C 67/0055* (2013.01); *B29C 70/16* (2013.01);
(Continued)

(58) Field of Classification Search
CPC ............ G05B 19/4097; G05B 19/4099; G05B 12/02; B33Y 50/02
See application file for complete search history.

(56) References Cited

U.S. PATENT DOCUMENTS

| | | | |
|---|---|---|---|
| 5,002,712 A | 3/1991 | Goldmann et al. | |
| 5,037,691 A | 8/1991 | Medney et al. | |

(Continued)

FOREIGN PATENT DOCUMENTS

| | | |
|---|---|---|
| CN | 101133107 A | 2/2008 |
| CN | 101193953 A | 6/2008 |

(Continued)

OTHER PUBLICATIONS

Ahn et al., Anisoptropic material properties of fused deposition modeling ABS, Rapid Prorotyping vol. 8, No. 4, 2002, pp. 248-257.
(Continued)

*Primary Examiner* — Alison L Hindenlang
(74) *Attorney, Agent, or Firm* — Lando & Anastasi, LLP

(57) ABSTRACT

A three-dimensional geometry is received, and sliced into layers. A first anisotropic fill tool path for controlling a three dimensional printer to deposit a substantially anisotropic fill material is generated defining at least part of an interior of a first layer. A second anisotropic fill tool path for controlling a three dimensional printer to deposit the substantially anisotropic fill material defines at least part of an interior of a second layer. A generated isotropic fill material tool path defines at least part of a perimeter and at least part of an interior of a third layer intervening between the first and second layers.

20 Claims, 31 Drawing Sheets

Related U.S. Application Data continuation-in-part of application No. 14/222,318, filed on Mar. 21, 2014, now abandoned, application No. 14/491,439, which is a continuation-in-part of application No. 14/333,881, filed on Jul. 17, 2014, now Pat. No. 9,149,988.

(60) Provisional application No. 61/907,431, filed on Nov. 22, 2013, provisional application No. 61/902,256, filed on Nov. 10, 2013, provisional application No. 61/883,440, filed on Sep. 27, 2013, provisional application No. 61/881,946, filed on Sep. 24, 2013, provisional application No. 61/880,129, filed on Sep. 19, 2013, provisional application No. 61/878,029, filed on Sep. 15, 2013, provisional application No. 61/847,113, filed on Jul. 17, 2013, provisional application No. 61/831,600, filed on Jun. 5, 2013, provisional application No. 61/815,531, filed on Apr. 24, 2013, provisional application No. 61/804,235, filed on Mar. 22, 2013.

(52) U.S. Cl.
CPC .............. *B33Y 10/00* (2014.12); *G05B 15/02* (2013.01); *G06F 17/50* (2013.01); *B29K 2025/08* (2013.01); *B29K 2063/00* (2013.01); *B29K 2071/00* (2013.01); *B29K 2077/00* (2013.01); *B29K 2079/085* (2013.01); *B33Y 50/02* (2014.12)

(56) References Cited

U.S. PATENT DOCUMENTS

| | | | |
|---|---|---|---|
| 5,155,324 A * | 10/1992 | Deckard | B29C 67/0077 264/497 |
| 5,340,433 A | 8/1994 | Crump | |
| 5,866,058 A | 2/1999 | Batchelder et al. | |
| 5,906,863 A | 5/1999 | Lombardi et al. | |
| 5,936,861 A | 8/1999 | Jang et al. | |
| 6,153,034 A | 11/2000 | Lipsker | |
| 6,363,606 B1 | 4/2002 | Johnson, Jr. et al. | |
| 6,934,600 B2 | 8/2005 | Jang et al. | |
| 7,127,309 B2 | 10/2006 | Dunn et al. | |
| 8,066,842 B2 | 11/2011 | Farmer et al. | |
| 8,221,669 B2 | 7/2012 | Batchelder et al. | |
| 9,370,896 B2 | 6/2016 | Mark | |
| 2002/0009935 A1 | 1/2002 | Hsiao et al. | |
| 2002/0062909 A1 | 5/2002 | Jang et al. | |
| 2002/0079607 A1 | 6/2002 | Hawley et al. | |
| 2002/0113331 A1 | 8/2002 | Zhang et al. | |
| 2002/0165304 A1 | 11/2002 | Mulligan et al. | |
| 2003/0044593 A1 | 3/2003 | Vaidyanathan et al. | |
| 2003/0056870 A1 | 3/2003 | Comb et al. | |
| 2003/0090034 A1 | 5/2003 | Mulhaupt et al. | |
| 2003/0186042 A1 | 10/2003 | Dunlap et al. | |
| 2003/0236588 A1 | 12/2003 | Jang et al. | |
| 2005/0061422 A1 | 3/2005 | Martin | |
| 2005/0104257 A1 | 5/2005 | Gu et al. | |
| 2005/0109451 A1 | 5/2005 | Hauber et al. | |
| 2005/0230029 A1 | 10/2005 | Vaidyanathan et al. | |
| 2007/0003650 A1 | 1/2007 | Schroeder | |
| 2007/0228592 A1 | 10/2007 | Dunn et al. | |
| 2008/0176092 A1 | 7/2008 | Owens | |
| 2009/0054552 A1 | 2/2009 | Yano et al. | |
| 2009/0065965 A1 | 3/2009 | Bowen | |
| 2009/0095410 A1 | 4/2009 | Oldani | |
| 2009/0174709 A1 | 7/2009 | Kozlak et al. | |
| 2010/0191360 A1 * | 7/2010 | Napadensky | B29C 67/0059 700/98 |
| 2010/0203351 A1 | 8/2010 | Nayfeh | |
| 2011/0032301 A1 | 2/2011 | Fienup et al. | |
| 2011/0143108 A1 | 6/2011 | Fruth et al. | |
| 2011/0178621 A1 * | 7/2011 | Heide | B29C 67/0055 700/98 |
| 2011/0222081 A1 | 9/2011 | Yi et al. | |
| 2011/0230111 A1 | 9/2011 | Weir et al. | |
| 2011/0289791 A1 | 12/2011 | Menchik et al. | |
| 2012/0060468 A1 | 3/2012 | Dushku et al. | |
| 2012/0231225 A1 | 9/2012 | Mikulak et al. | |
| 2012/0247655 A1 | 10/2012 | Erb et al. | |
| 2013/0004610 A1 | 1/2013 | Hartmann et al. | |
| 2013/0164498 A1 | 6/2013 | Langone et al. | |
| 2013/0209600 A1 | 8/2013 | Tow | |
| 2013/0233471 A1 | 9/2013 | Kappesser et al. | |
| 2013/0327917 A1 | 12/2013 | Steiner et al. | |
| 2013/0337256 A1 | 12/2013 | Farmer et al. | |
| 2013/0337265 A1 | 12/2013 | Farmer | |
| 2014/0061974 A1 | 3/2014 | Tyler | |
| 2014/0120197 A1 | 5/2014 | Swanson et al. | |
| 2014/0159284 A1 | 6/2014 | Leavitt | |
| 2014/0175706 A1 | 6/2014 | Kritchman | |
| 2014/0232035 A1 | 8/2014 | Bheda | |
| 2014/0268604 A1 | 9/2014 | Wicker et al. | |
| 2014/0287139 A1 | 9/2014 | Farmer et al. | |
| 2014/0291886 A1 | 10/2014 | Mark et al. | |
| 2014/0328963 A1 | 11/2014 | Mark et al. | |
| 2014/0328964 A1 | 11/2014 | Mark et al. | |
| 2014/0361460 A1 | 12/2014 | Mark | |
| 2015/0037446 A1 | 2/2015 | Douglass et al. | |
| 2015/0165666 A1 | 6/2015 | Butcher et al. | |
| 2015/0239178 A1 | 8/2015 | Armstrong | |
| 2015/0266243 A1 | 9/2015 | Mark et al. | |
| 2016/0346997 A1 | 12/2016 | Lewis et al. | |

FOREIGN PATENT DOCUMENTS

| | | |
|---|---|---|
| CN | 101300299 A | 11/2008 |
| CN | 101484397 A | 7/2009 |
| CN | 101801647 A | 8/2010 |
| CN | 104149339 A | 11/2014 |
| DE | 4102257 A1 | 7/1992 |
| JP | 1-266231 A | 10/1989 |
| KR | 20100004475 A | 1/2010 |
| KR | 100995983 B1 | 11/2010 |
| KR | 101172859 B1 | 8/2012 |
| WO | 2009009137 A1 | 1/2009 |
| WO | 2013017284 A2 | 2/2013 |
| WO | 2015042422 A1 | 3/2015 |

OTHER PUBLICATIONS

August et al., Recent Developments in Automated Fiber Placement of Thermoplastic Composites, SAMPE Technical Conference Proceedings, Wichita, KS, Oct. 23, 2013.

Dell'Anno et al., Automated Manufacture of 3D Reinforced Aerospace Composite Structures, International Journal of Structural Integrity, 2012, vol. 3, Iss 1, pp. 22-40.

Devleig et al., High-Speed Fiber Placement on Large Complex Structures, No. 2007-01-3843. SAE International 2007.

Hasenjaeger, Programming and Simulating Automated Fiber Placement (AFP) CNC Machines, SAMPE Journal, vol. 49, No. 6, Nov./Dec. 2013.

Hossain et al, Improving Tensile Mechanical Properties of FDM-Manufactured Specimens via Modifying Build Parameters, Proceedings of Solid Freeform Fabrication Symposium, Austin, Texas, Aug. 16, 2013.

Lamontia et al, "Contoured Tape Laying and Fiber Placement Heads for Automated Fiber Placement of Large Composite Aerospace Structures," 34th ISTC, Baltimore, Md, Nov. 4-7, 2002.

Mondo et al., Overview of Thermoplastic Composite ATL and AFP Technologies, ITHEC 2012, Oct. 30, 2012, Messe Bremen, Germany.

Notification of Transmittal of the International Search Report and the Written Opinion of the International Searching Authority for Corresponding PCT/US2014/056590 mailed Dec. 24, 2014.

Rower, Robot Driven Automatic Tapehead for Complex Composite Lay-ups, No. 10AMAF-0066, SAE International 2010, Aerospace Manufacturing and Automated Fastening Conference & Exhibition, Sep. 28, 2010.

(56) References Cited

OTHER PUBLICATIONS

Zieman et al., Anisotropic Mechanical Properties of ABS Parts Fabricated by Fused Deposition Modelling, INTECH Open Access Publisher, 2012.
Notification of Transmittal of the International Search Report and the Written Opinion of the International Searching Authority, or the Declaration for PCT/US2014/047042 dated Nov. 25, 2014.
Slocum, Alexander: "Kinematic Couplings: A Review of Design Principles and Applications", International Journal of Machine Tools and Manufacture 50.4 (2010): 310-327.
Brett Compton, "3D printing of composites with controlled architecture," Engineering Conferences International, ECI Digital Archives, Composites at Lake Louise (CALL 2015), Fall Nov. 9, 2015, pp. 30.
Brett G. Compton and Jennifer A. Lewis, "3D-Printing of Lighweight Cellular Compsites," Advanced Materials 2014, 26, pp. 5930-5935.
Geek magazine—hacker daily blog "To Skolkovo created the Russia's first composite 3D-printer", Feb. 24, 2015, Retreived from the internet: <http://geek-mag.com/posts/246332/>.
This 3D printer could allow ISS components to be created in space—YouTube. Published on May 20, 2016. Retreived from the internet: <URL:<https://www.youtube.com/watch?v=YwrTfOjEFtw>.

\* cited by examiner

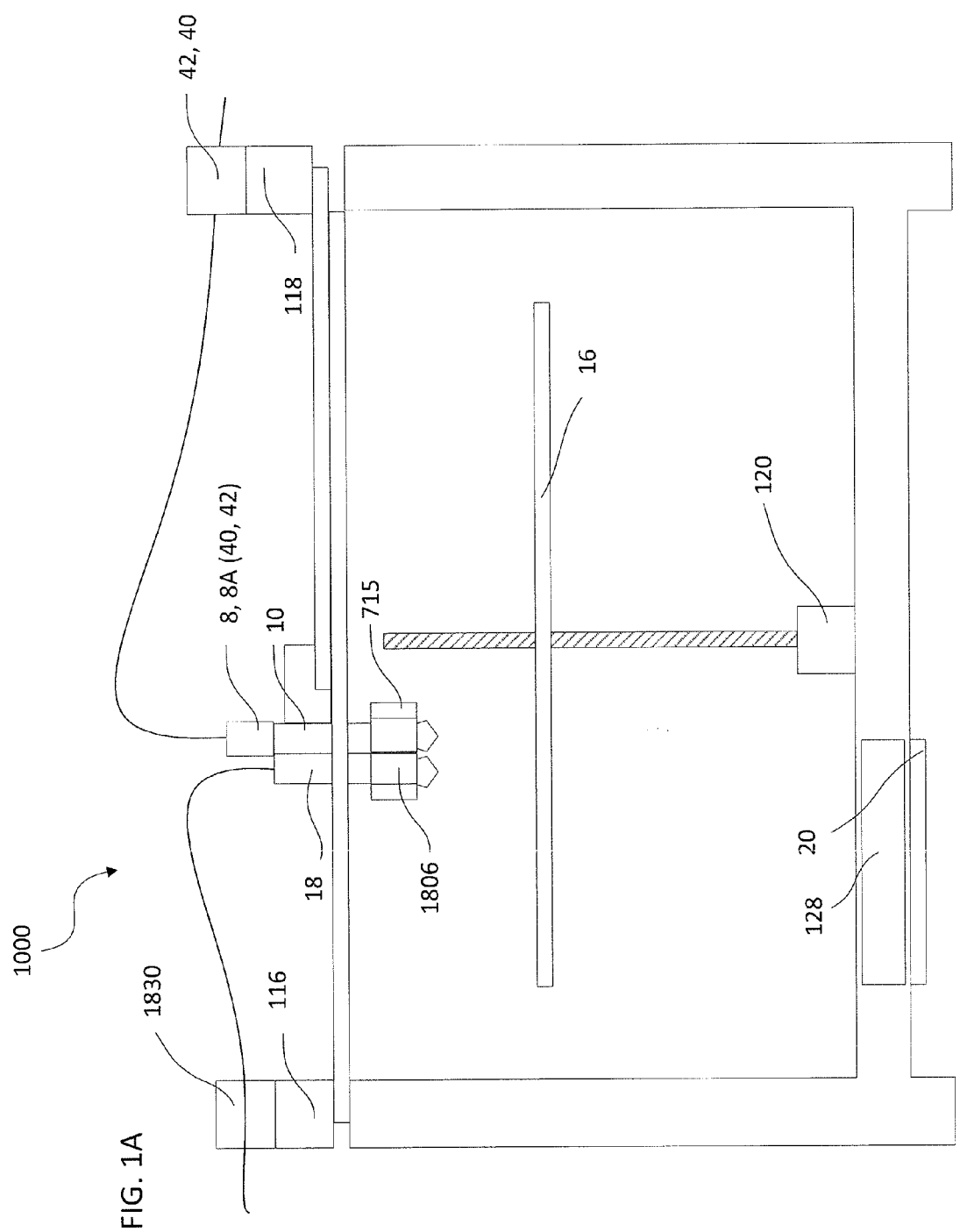

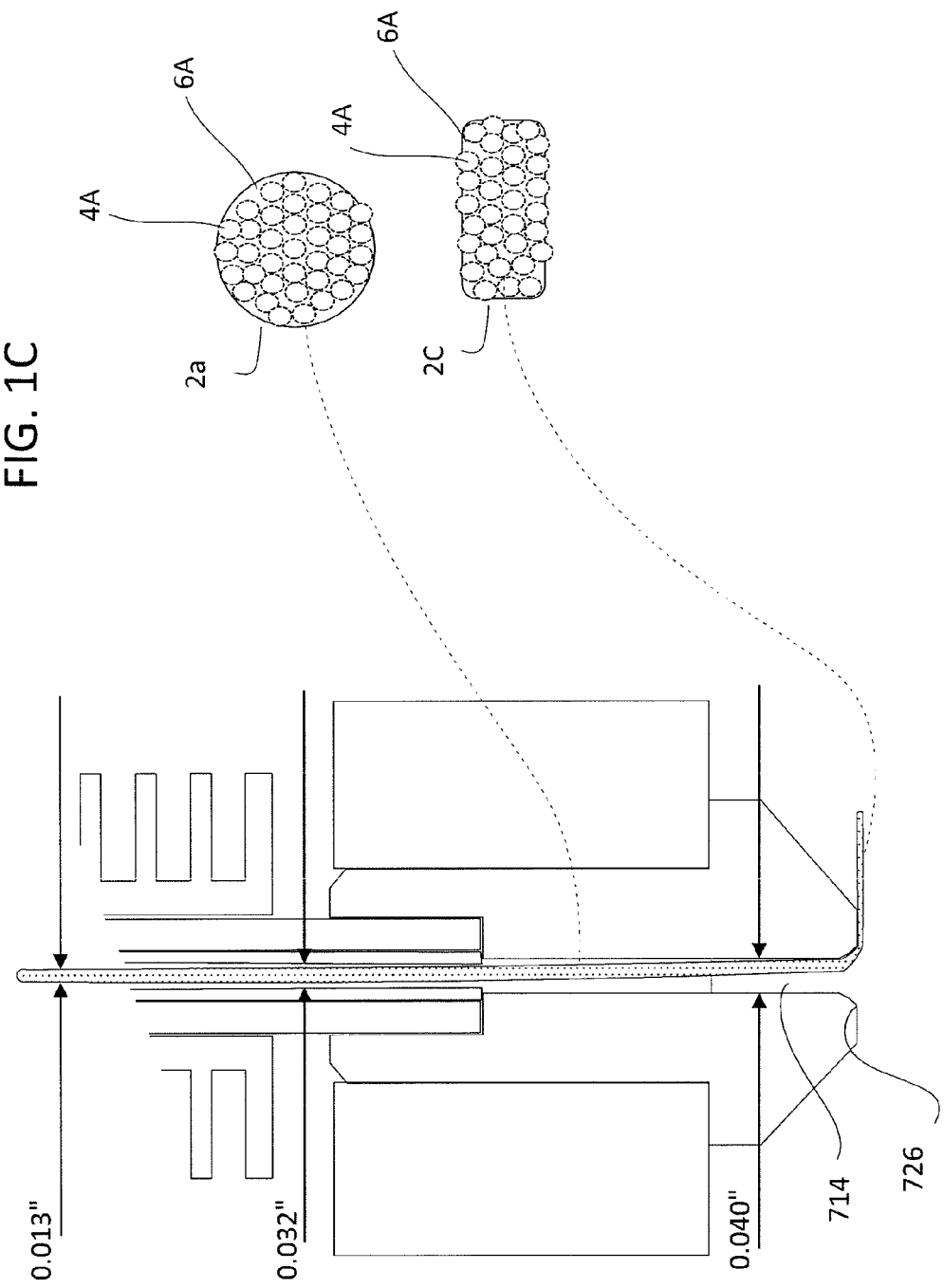

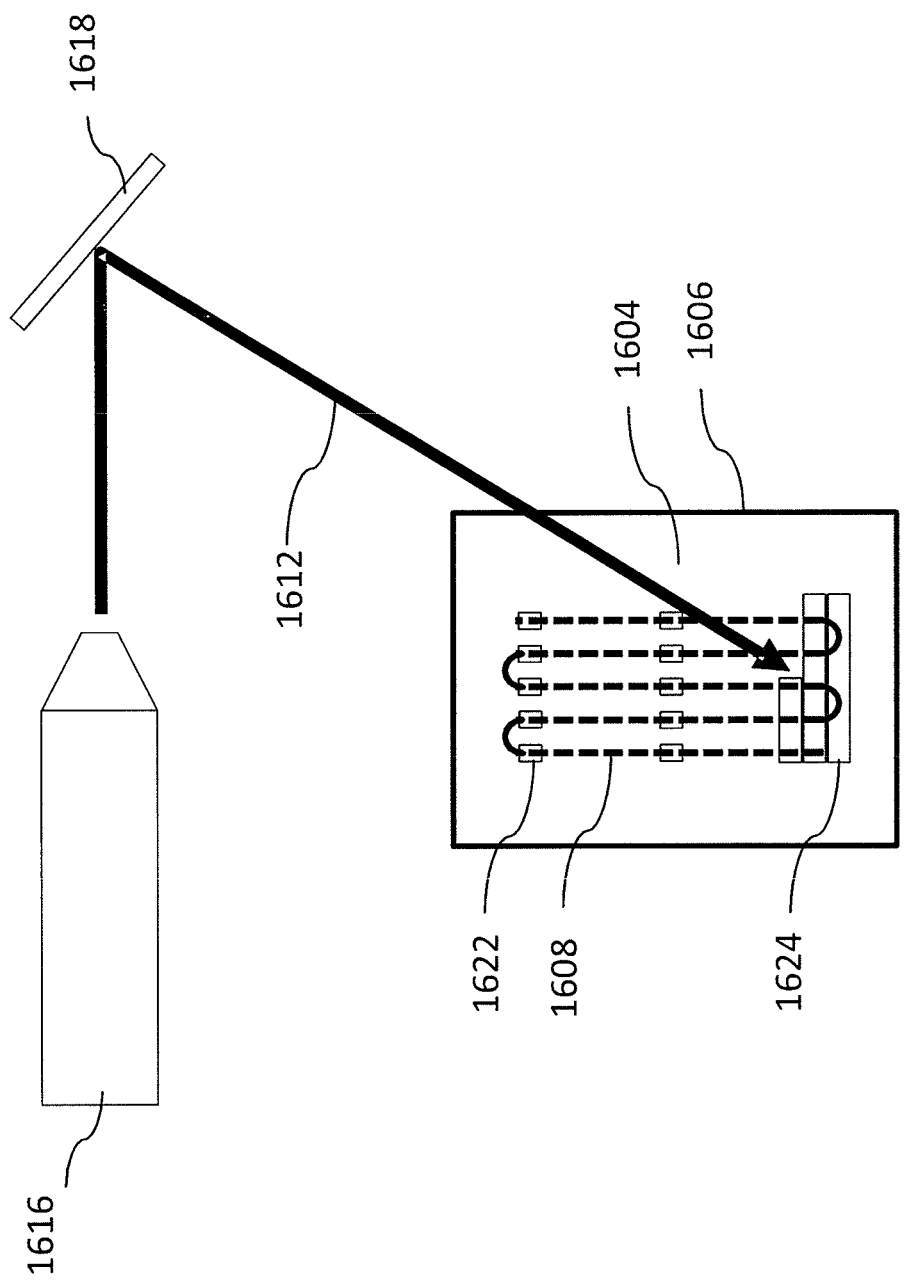

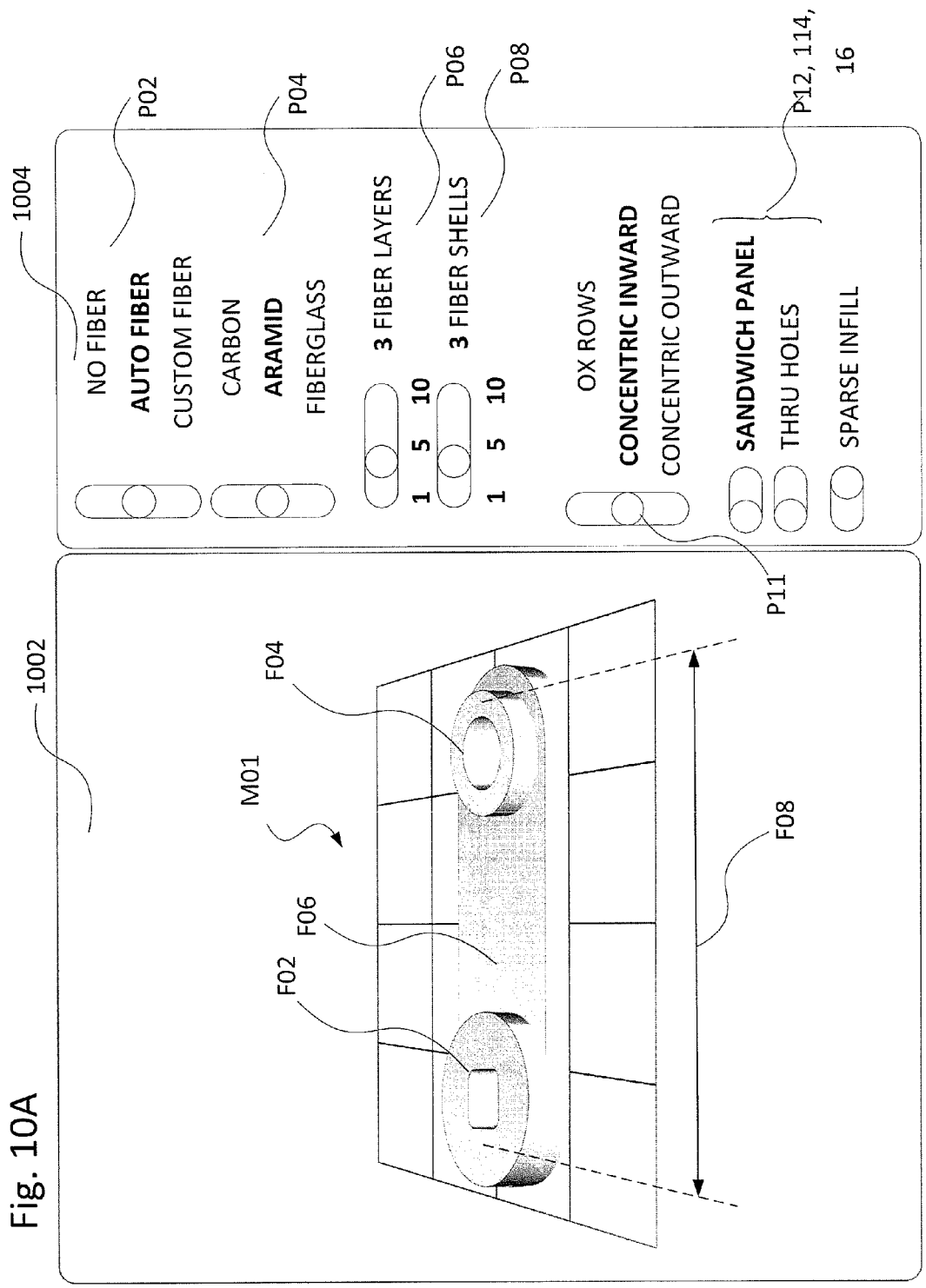

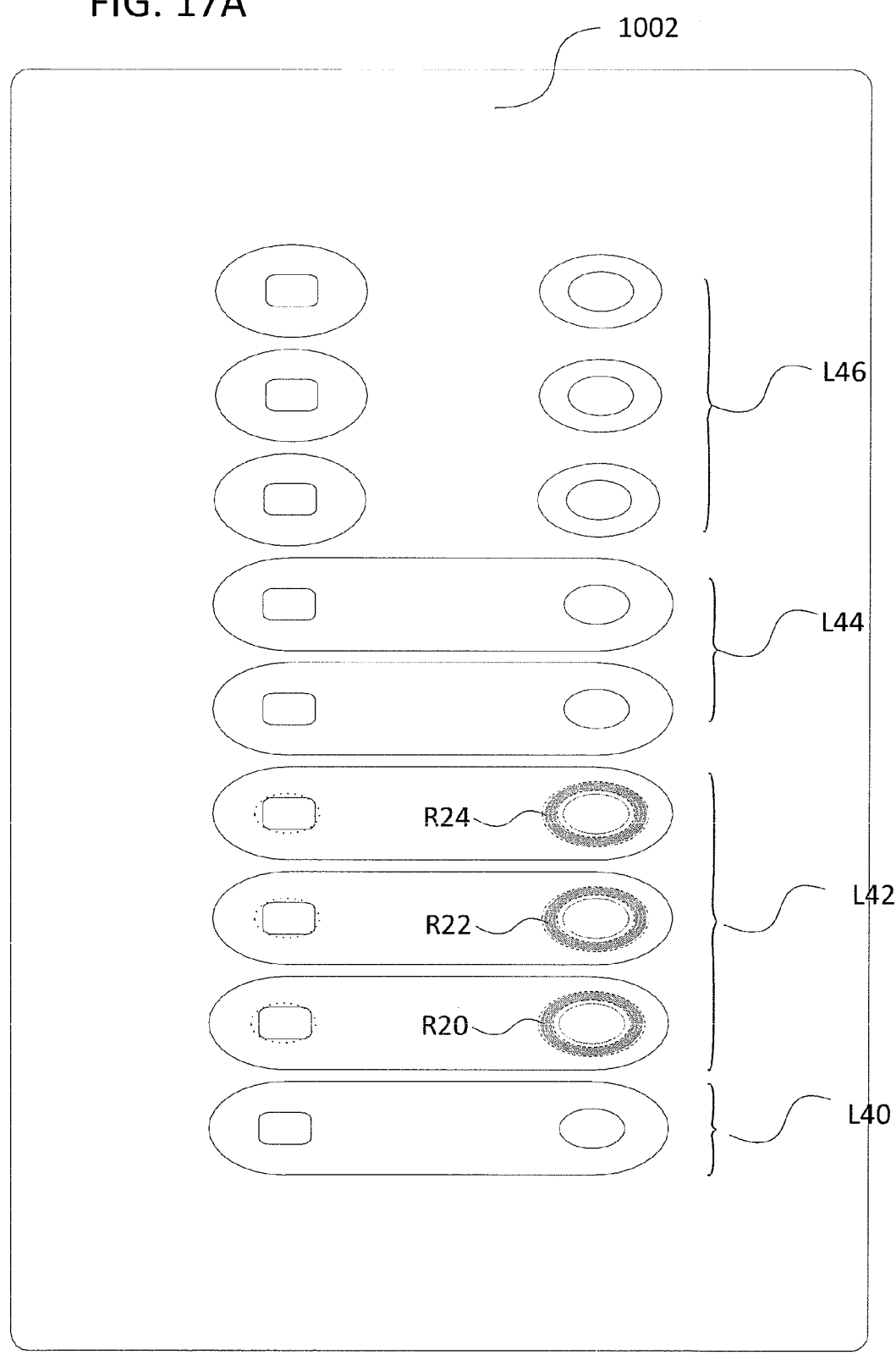

Fig. 20    RULE/PARAMETER DATABASE

| Toolpath N...M | Trajectory Definition | Material | | |
|---|---|---|---|---|
| Region N...M | Fill Density | Fill Pattern | | |
| Region N...M | Use Fiber (T) | Fiber Layers (3) | Fiber Type (F, CAF) | Concentric Rings (2) |
| Layer N...M | Pause After Layer (T) | | | |
| Layer N...M | Use Fiber (T) | Fiber Layers (3) | Fiber Type (F, CAF) | Concentric Rings (2) |
| Layer N...M | Fill Density | Fill Pattern | | |
| Global | Wall Layers (3, 2-5) | | | |
| Global | Roof & Floor Layers (4, 2-10) | | | |
| Global | Use Fiber (T) | Fiber Layers (3) | Fiber Type (F, CAF) | Concentric Rings (2) |
| Global | Use Supports (T) | Support (S, P) | | |
| Global | Fill Density | Fill Pattern | | |

METHODS FOR FIBER REINFORCED ADDITIVE MANUFACTURING

CROSS-REFERENCE TO RELATED APPLICATIONS

This application claims the benefit under 35 U.S.C. §119 (e) of U.S. provisional application Ser. Nos. 61/880,129, filed Sep. 19, 2013; 61/881,946, filed Sep. 24, 2013; 61/883,440, filed Sep. 27, 2013; 61/902,256, filed Nov. 10, 2013, and 61/907,431, filed Nov. 22, 2013; as well as claiming the benefit under 35 U.S.C. §119(e) of, and being a continuation-in-part of each of U.S. patent application Ser. No. 14/222,318, filed Mar. 21, 2014; U.S. patent application Ser. No. 14/297,437, filed Jun. 5, 2014; and U.S. patent application Ser. No. 14/333,881, filed Jul. 17, 2014; the disclosures of which are herein incorporated by reference in their entirety. The disclosures of U.S. provisional application Ser. Nos. 61/804,235; 61/815,531; 61/831,600; 61/847,113, and 61/878,029 are herein incorporated by reference in their entireties.

FIELD

Aspects relate to three dimensional printing.

BACKGROUND

"Three dimensional printing" as an art includes various methods such as Stereolithography (SLA) and Fused Filament Fabrication (FFF). SLA produces high-resolution parts, typically not durable or UV-stable, and is used for proof-of-concept work; while FFF extrudes through a nozzle successive filament beads of ABS or a similar polymer.

In the art of "Composite Lay-up", preimpregnated ("prepreg") composite sheets of fabric impregnated with a resin binder are layered into a mold, heated, and cured. In "Composite Filament Winding" sticky "tows" including multiple thousands of individual carbon strands are wound around a custom mandrel to form a rotationally symmetric part.

There is no commercial or experimental technique for orienting fiber during additive manufacturing to anisotropically improve properties of the finished part.

SUMMARY

According to a first embodiment and/or aspect of the present invention, a method for generating three-dimensional toolpath instructions for a three dimensional printer, includes receiving a three-dimensional geometry and slicing it three-dimensional geometry into layers. An isotropic fill material (e.g., polymer) contour tool path for controlling a three dimensional printer to deposit the material defines at least part of a perimeter of the first layer. An anisotropic fill tool path for controlling a three dimensional printer to deposit a substantially anisotropic fill material (e.g., continuous fiber reinforced polymer) defines at least part of an interior of the first layer. An anisotropic characteristic of the substantially anisotropic fill material is oriented relative to a trajectory of the anisotropic fill tool path.

Alternatively, or in addition, according to another embodiment and/or aspect of the present invention, a method generates toolpath instructions for a three dimensional printer for a first anisotropic fill material tool path defining at least part of an interior of a first layer, a second anisotropic fill material tool path defining at least part of an interior of a second layer, and an isotropic fill material tool path defining at least part of a perimeter and at least part of an interior of a third layer intervening between the first and second layers.

Alternatively, or in addition, according to another embodiment and/or aspect of the present invention, one of the anisotropic fill tool paths for controlling a three dimensional printer to deposit a substantially anisotropic fill material is deposited in a location adjacent to and reinforcing a negative subcontour within an interior of the first layer.

Alternatively, or in addition, according to another embodiment and/or aspect of the present invention, one of the anisotropic fill toolpaths is computed based on the other anisotropic fill tool path, and is in a location adjacent to and reinforcing the anisotropic tool path of the first layer. Optionally, this computed second anisotropic fill toolpath is located within the first layer. Alternatively or in addition, this computed second anisotropic fill toolpath is located within a second layer adjacent to the first layer.

Alternatively, or in addition, according to another embodiment and/or aspect of the present invention, the one of the anisotropic tool paths defines at least part of an interior of a first layer and includes a first start point, and another anisotropic tool path defines at least part of an interior of a second layer, and includes a second start point offset from the first start point.

Alternatively, or in addition, according to another embodiment and/or aspect of the present invention, one of the anisotropic tool paths defines at least part of an interior of a first layer and includes a first crossover to an adjacent portion of the first anisotropic toolpath, and wherein another anisotropic tool path defines at least part of an interior of a second layer, and includes a second crossover to an adjacent portion of that anisotropic toolpath, the second crossover being offset from the first crossover.

Alternatively, or in addition, according to another embodiment and/or aspect of the present invention, two anisotropic fill tool paths for controlling a three dimensional printer to deposit the substantially anisotropic fill material are generated, one based upon the other but in a remote layer, and a centroid is established between them. An isotropic fill material tool path for controlling a three dimensional printer to deposit a substantially isotropic fill material defines at least part of a perimeter and at least part of an interior of a third layer, optionally proximate the centroid, and intervening between the first and second layers.

Alternatively, or in addition, according to another embodiment and/or aspect of the present invention, one of the anisotropic fill tool paths follows an irregular trajectory including an offset from a compound subcontour boundary. Alternatively, or in addition, crossovers are generated between adjacent offsets of the anisotropic fill tool path, and the cross-overs are arranged on a curved portion of the anisotropic fill tool path.

BRIEF DESCRIPTION OF DRAWINGS

FIGS. 1A through 1C are schematic representations of a three dimensional printing system using a continuous core reinforced filament together with an extruded resin filament, in which FIG. 1A is a schematic view of a continuous core reinforced filament-extrusion printer, FIG. 1B is a cross-sectional and schematic view of a compound extrusion and fiber printhead assembly, and FIG. 1C is a close-up cross-section of a fiber printhead assembly;

FIGS. 2A through 2C are schematic representations of a three dimensional printing system using a continuous core reinforced filament together with stereolithography or selective laser sintering in which FIGS. 1A and 1B are schematic views of a continuous core reinforced filament-SLA/SLS printer, and FIG. 1C is a schematic view of a tacking process;

FIG. 10A shows an exemplary on-screen part rendering and logic structure for the rule processing of FIG. 9 for global operations;

FIGS. 17A-17C show models, renderings, representations of toolpaths, and data structures as carried out by the part rendering and logic structure of FIG. 16, for a region extrusion example;

FIG. 20 shows a rule and parameter database structure for the present embodiments.

DETAILED DESCRIPTION

In the present disclosure, "3D printer" is inclusive of both discrete printers and/or toolhead accessories to manufacturing machinery which carry out an additive manufacturing sub-process within a larger process. With reference to FIGS. 1-5, A 3D printer is controlled by a motion controller 20 which interprets dedicated G-code 702 and drives various actuators of the 3D printer in accordance with the G-code 702.

As used herein, "extrusion" shall have its conventional meaning, e.g., a process in which a stock material is pressed through a die to take on a specific shape of a lower cross-sectional area than the stock material. Fused Filament Fabrication (FFF) is an extrusion process. Similarly, "extrusion nozzle" shall have its conventional meaning, e.g., a device designed to control the direction or characteristics of an extrusion fluid flow, especially to increase velocity and/or restrict cross-sectional area, as the fluid flow exits (or enters) an enclosed chamber. The present disclosure shall also use the coined word "conduit nozzle" or "nozzlet" to describe a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part). As used herein, "deposition head" shall include extrusion nozzles, conduit nozzles, and/or hybrid nozzles.

Lastly, in the three-dimensional printing art, "filament" typically refers to the entire cross-sectional area of a spooled build material, while in the composites art, "filament" refers to individual fibers of, for example, carbon fiber (in which, for example, a "1K tow" will have 1000 individual strands). For the purposes of the present disclosure, "filament" shall retain the meaning from three-dimensional printing, and "strand" shall mean individual fibers that are, for example, embedded in a matrix, together forming an entire composite "filament".

Figure 1B:
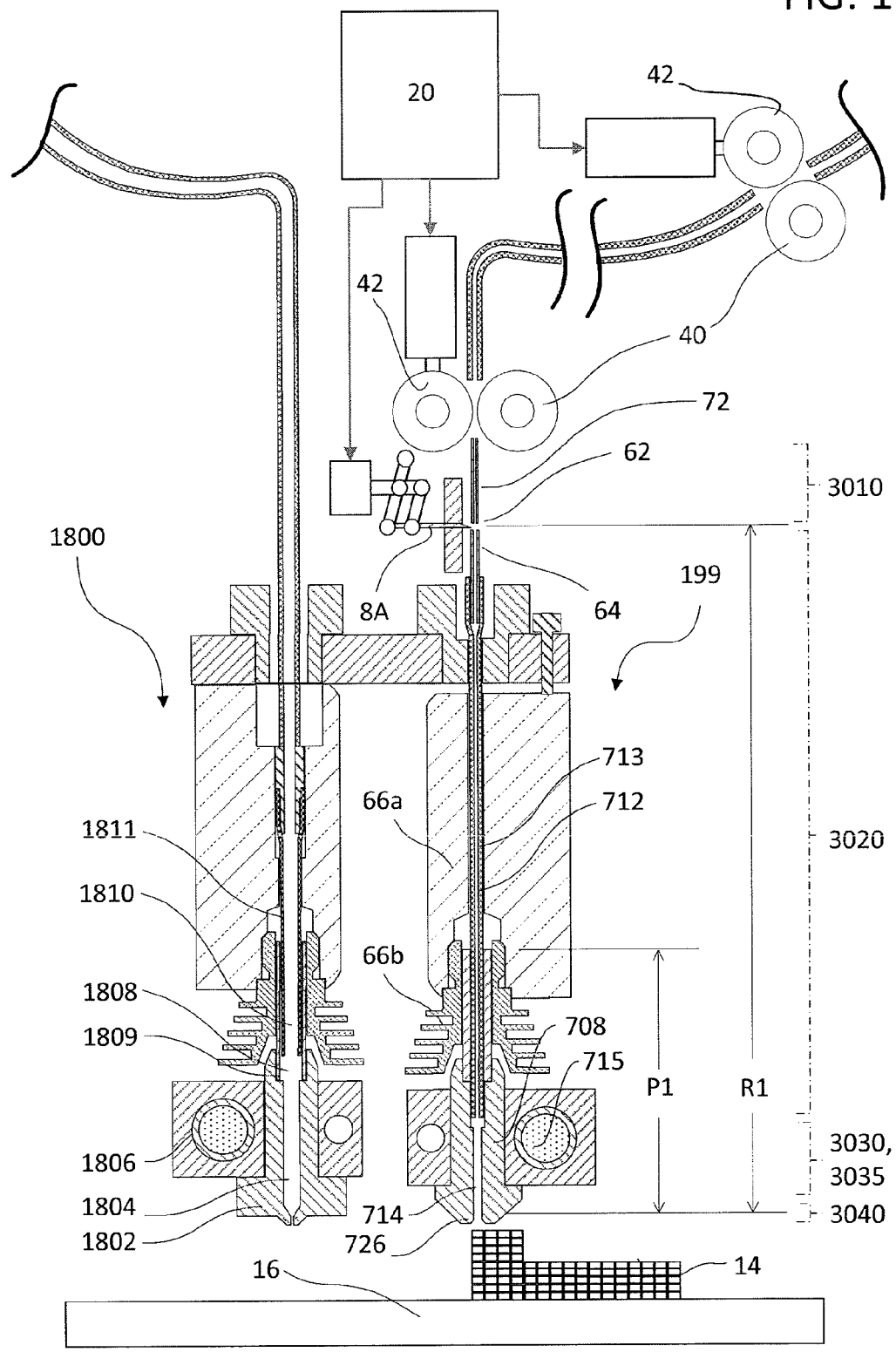

FIGS. 1A-1C depict embodiments of three dimensional printers, each with at least two printing approaches—one which applies a fiber reinforced composite filament, and one which applies pure or neat matrix resin (thermoplastic or curing). The fiber reinforced composite filament 2 (also referred to herein as continuous core reinforced filament) may be substantially void free and include a polymer or resin that coats or impregnates an internal continuous single core or multistrand core.

The fiber reinforced composite filament 2 is fed through a conduit nozzle 10 heated (e.g., by a band heater or coil heater) to a controlled temperature selected for the matrix material to maintain a predetermined viscosity, force of adhesion of bonded ranks, and/or a surface finish. In some embodiments, the filament 2 is dragged or pulled through the conduit nozzle 10.

After being heated in the conduit nozzle 10 and having the matrix material or polymer 4 substantially melted, the continuous core reinforced filament 2 is applied onto a build platen 16 to build successive layers 14 to form a three dimensional structure. One or both of (i) the position and orientation of the build platen 16 or (ii) the position and orientation of the conduit nozzle 10 are controlled by a controller 20 to deposit the continuous core reinforced filament 2 in the desired location and direction. Position and orientation control mechanisms include gantry systems, robotic arms, and/or H frames, any of these equipped with position and/or displacement sensors to the controller 20 to monitor the relative position or velocity of conduit nozzle 10 relative to the build platen 16 and/or the layers 14 of the part being constructed. The controller 20 may use sensed X, Y, and/or Z positions and/or displacement or velocity vectors to control subsequent movements of the conduit nozzle 10 or platen 16. For example, the three dimensional printer 1000 may include displacement, velocity, or acceleration transducers in any of three translation and/or three rotation axes detecting a position or movement of the conduit nozzle 10 relative to the build platen 16. A (e.g., laser) range sensor may scan the section ahead of the conduit nozzle 10 in order to correct the Z height of the conduit nozzle 10, or the fill volume required, to match a desired deposition profile.

The three dimensional printer 1000 may include a cutter 8 controlled by the controller 20 that cuts the continuous core reinforced filament (e.g., without the formation of tails) during the deposition process in order to (i) form separate features and components on the structure as well as (ii) control the directionality or anisotropy of the deposited material and/or bonded ranks in multiple sections and layers. FIG. 1A also depicts at least one secondary print head 18 optionally employed with the three dimensional printer 1000 to print, e.g., protective coatings on the part including 100% resin FFF extrusion, a UV resistant or a scratch resistant coating. A description of a coupled or compound FFF printhead 1800 may be found herein, and this description applies to protective coatings in general.

As depicted in FIGS. 1A-1C, upstream of a driven roller 42 and an idle roller 40, a spool (not shown) supplies under mild tension an unmelted void free fiber reinforced composite filament. The filament including at least one axial fiber strand extending within a matrix material of the filament, having no substantial air gaps within the matrix material. In this example, the fiber reinforced composite filament 2 includes a nylon matrix 4A that impregnates hundreds or thousands of continuous carbon fiber strands 6A.

The driven roller 42 and an idle roller 40 feed or push the unmelted filament at a feed rate (optionally variably controllable by the controller 20, optionally less than the printing rate, and optionally a differential between the feed and printing rates absorbed by a one-way bearing), along a clearance fit zone that prevents buckling of filament.

Initially, in a threading stage, the melted matrix material 6A and the axial fiber strands 4A of the filament 2 are pressed into the part with axial compression, and as the build platen and print head are translated with respect to one another, the end of the filament contacts the ironing lip 726 and is subsequently continually ironed in a transverse pressure zone 3040 to form bonded ranks in the part 14.

Either or both of the printing head or conduit nozzle 708 or the build platform 16 may be translated, e.g., the feed rate and/or the printing rate are controlled to maintain compression in the filament in the threading stage, and to maintain neutral to positive tension in the printing operation. The matrix material 4A of the filament 2 may be heated and melted in the non-contact zone (in particular, so that there is less opportunity to stick to the walls of the conduit nozzle 708), but is in this embodiment generally melted or liquefied at the ironing lip or tip 726. The feed and printing rates may be monitored or controlled to maintain compression, neutral tension, or positive tension within the unsupported zone as well as primarily via axial compressive or tensile force within fiber strand(s) extending along the filament.

As shown in FIGS. 1B and 1C, the transverse pressure zone 3040 includes an ironing lip 726 that reshapes the filament 2. This ironing lip 726 compacts or presses the filament 2 into the part and may also receive heat conducted from the heated walls 714, in order to melt or liquefy the matrix material 4A in the transverse pressure zone 3040. Optionally, the ironing lip 726 in the transverse pressure zone 3040 flattens the melted filament 2 on the top side, applying an ironing force to the melted matrix material and the axial fiber strands as the filament 2 is deposited in bonded ranks. This may be facilitated by ensuring that the height of the bottom of the ironing lip 726 to the top of the layer below is less than the diameter of the filament. Another reshaping force is applied as a normal reaction force from the part itself, which flattens the bonded ranks on at least two sides as the melted matrix material 4A and the axial fiber strands 6A are ironed to form laterally and vertically bonded ranks (i.e., the ironing also forces the bonded ranks into adjacent ranks). The pressure and heat applied by ironing improves diffusion and fiber penetration into neighboring ranks.

Unmelted fiber reinforced filament is cut at or adjacent the clearance fit zone, but may be may be cut in a gap 62 between a guide tube 72 (having a clearance fit) and the conduit nozzle 708; within the conduit nozzle 708, e.g., upstream of the non-contact zone 3030; or alternatively or in addition, the core reinforced filament may be cut by a cutter 8 positioned at or adjacent either one of the clearance fit zone 3010, 3020 or the ironing lip 725.

After the matrix material 6A is melted by the ironing lip or tip 726, the feed and/or printing rate can be controlled by the controller 20 to maintain neutral to positive tension in the composite filament 2 between the ironing lip 726 and the part 14 primarily via tensile force within the fiber strands 4A extending along the filament 2, in particular at the end of bonded ranks; in making a turn to begin a new adjacent rank in the opposite direction; and/or to form bridges through open space, e.g. by bridging the fiber reinforced composite filament 2 in the transverse pressure zone 3040 from a connection to a first portion of the part across the open space to bridge then reconnect the fiber reinforced composite filament 2 to a second portion of the part 14. A substantially constant cross sectional area of the fiber reinforced composite filament is maintained in the clearance fit zone, the unsupported zone, the transverse pressure zone, and also as a bonded rank is attached to the workpiece or part 14.

FIG. 1B depicts a cross section of a compound (dual) print head with an extrusion printhead 1800 and extrusion nozzle 1802 for FFF and a fiber deposition printhead 199 and conduit nozzle 708 for continuous fiber reinforced thermoplastic deposition. Like numbered features are similar to those described with respect to FIGS. 1A and 1B.

With reference to FIG. 1B, each of the printheads 1800 and 199 are mounted on the same linear guide such that the X, Y motorized mechanism of the printer moves them in unison. As shown, the FFF printhead 1800 includes an extrusion nozzle 1802 with melt zone or melt reservoir 1804, a heater 1806 for heating the heater block and the nozzle. The melt reservoir 1804 continues into a high thermal gradient zone 1808, substantially formed by a thermal resistor 1809 mounted outside the heating block. A heat sink surrounds the thermal resistor 1809 to further enhance the thermal gradient. The thermal gradient separates the melt reservoir 1804 from an unmelted zone 1810, which may be inside the thermal resistor 1809 and/or a Teflon tube 1811. A 1.75-1.8 mm or 3 mm thermoplastic filament driven through, e.g., a Bowden tube provides extrusion back pressure in the melt reservoir 1804.

The companion continuous fiber embedded filament printhead 199, as shown, includes the conduit nozzle 708, the composite ironing tip 728, and the limited contact cavity 714, in this example each within a heating block heated by a heater 715. A cold feed zone 712 is formed within a receiving tube 64, including a capillary-like receiving tube of rigid material and a small diameter (e.g. inner diameter of 32 thou) Teflon/PTFE tube extending into the nozzle 708. The cold feed zone is surrounded in this case by a PEEK insulating block 66a and a heat sink 66b, but these are fully optional. In operation, an unattached terminal end of the fiber-embedded filament may be held in the cold feed zone, e.g., at height P1. Distance P1, as well as cutter-to-tip distance R1, are retained in a database for permitting the controller 20 to thread and advance the fiber-embedded filament as discussed herein. Further as shown, the controller 20 is operatively connected to the cutter 8, 8A, and feed rollers 42 facing idle rollers 40.

FIG. 1C shows a schematic close-up cross section of the conduit nozzle 708. As shown in FIG. 1C, and depicted essentially proportionately, the inner diameter of the receiving tube 64 (in this case, at a position where a Teflon/PTFE inner tube forms the inner diameter) is approximately 1½ to 2½ times (at, e.g., 32 thou) the diameter of the filament 2 (at, e.g., 13 thou) shown therewithin. The inner diameter or inner width of the terminal cavity 714 (at, e.g., 40 thou (is from two to six times the diameter of the filament 2 shown therein. These are preferred ranges, it is considered the diameter of the receiving tube may be from 1 1/10 to 3 times the diameter of the filament, and the inner diameter of the terminal cavity from two to 12 times the diameter of the filament. The terminal cavity is preferably of larger diameter than the receiving tube.

In addition, as shown in essentially proportionately in FIG. 1C the heated composite filament ironing tip 726 is moved relative to the part, at a height above the part of less than the filament diameter, to iron the fiber reinforced composite filament as it is deposited to reshape a substantially oval or circular bundle of inelastic axial fiber strands (labeled 2a) within the fiber reinforced composite filament to a substantially flattened block of inelastic fibers strands within a bonded rank (labeled 2C) of the part. Axial compression and/or laterally pressing the melted matrix filament 2 into bonded ranks may enhance final part properties. For example, FIG. 1C shows a composite fiber reinforced filament 2 applied with a compaction force, axial compression, or lateral pressure 62. The compaction pressure from axial compression and flattening from the ironing lip, compresses or reshapes the substantially circular cross-section filament 2a into the preceding layer below and into a second, substantially rectangular cross-section compacted shape. The entire filament forms a bonded rank (i.e., bonded to the layer below and previous ranks on the same layer) as it is shaped. The filament 2b both spreads and interior strands intrude into adjacent bonded ranks 2c on the same layer and is compressed into the underlying shaped filament or bonded rank of material 2d. This pressing, compaction, or diffusion of shaped filaments or bonded ranks reduces the distance between reinforcing fibers, and increases the strength of the resultant part (and replaces conventional techniques achieved in composite lay-up using post-processing with pressure plates or vacuum bagging). Accordingly, in some embodiments or aspect of the invention discussed herein, the axial compression of the filament 2 and/or especially the physical pressing by the printer head 70, conduit nozzle or ironing lip 508, 726, 208 in zone 3040 may be used to apply a compression pressure directly to the deposited material or bonded ranks to force them to spread or compact or flatten into the ranks beside and/or below. Cross-sectional area is substantially or identically maintained. Alternatively or in addition under some embodiments or aspects of the invention, pressure may be applied through a trailing pressure plate behind the print head; a full width pressure plate spanning the entire part that applies compaction pressure to an entire layer at a time; and/or heat, pressure, or vacuum may be applied during printing, after each layer, or to the part as a whole to reflow the resin in the layer and achieve the desired amount of compaction (forcing of walls together and reduction and elimination of voids) within the final part.

Figure 2A:
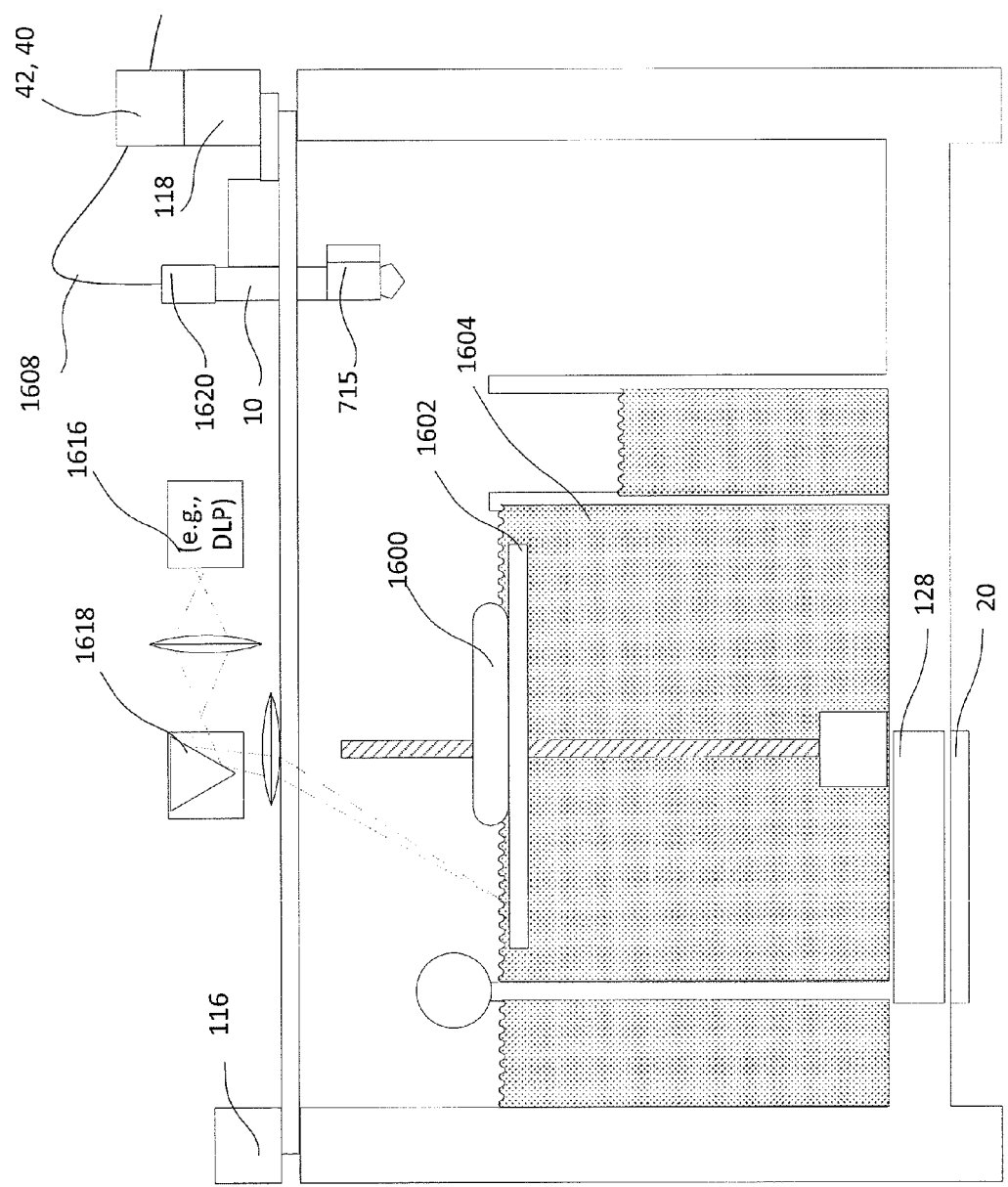
Figure 2B:
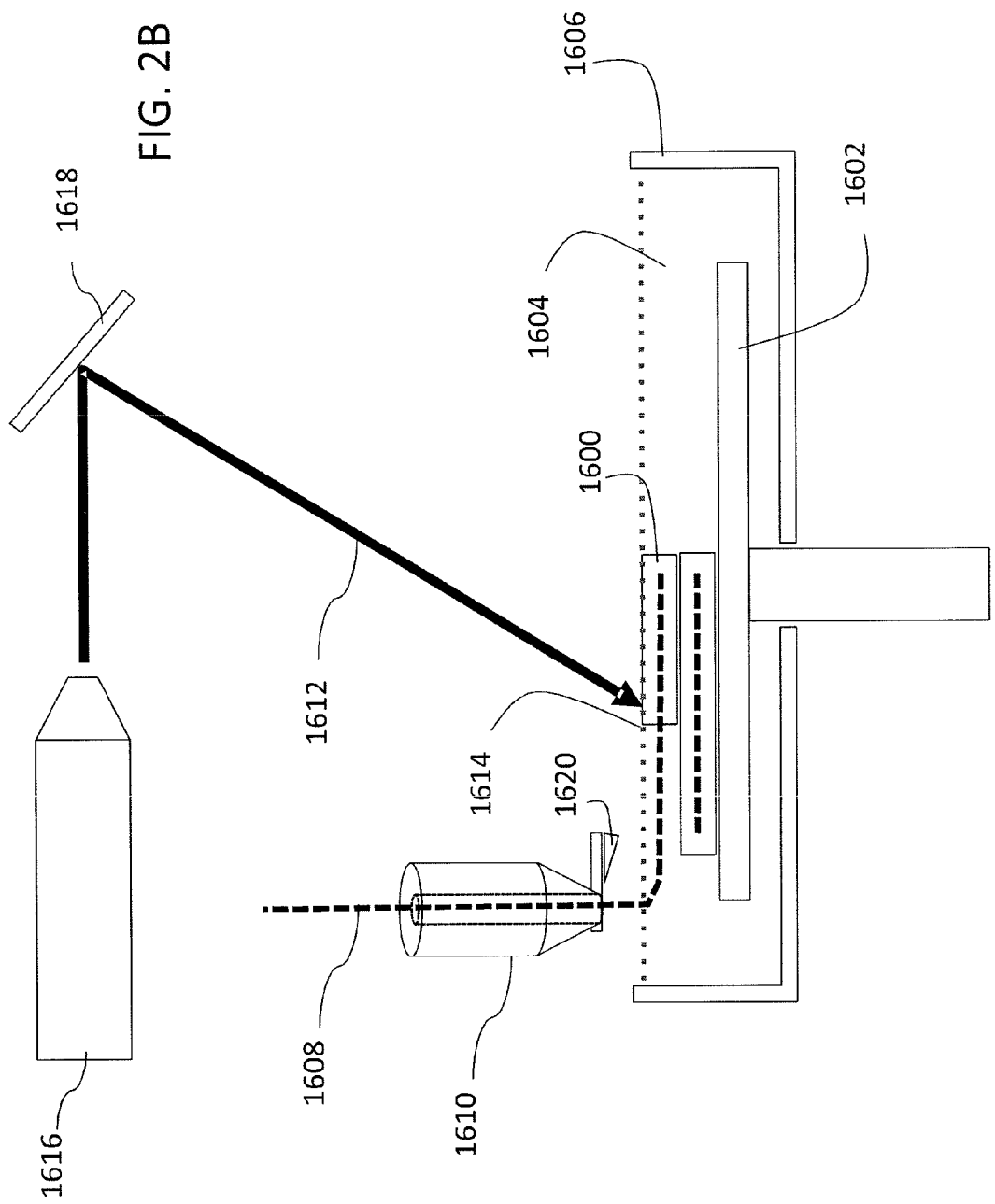

FIGS. 2A-2C depict an embodiment of a three dimensional printer 3001 in applying a fiber reinforced composite filament 2 together with DLP-SLA, SLA, or SSS to build a structure. Like numbered features are similar to those described with respect to FIG. 1A.

Although one embodiment or aspect of the invention uses thermoplastic matrix, hybrid systems are possible. A reinforced filament may employ a matrix that is finished by curing cycle, e.g., using heat, light, lasers, and/or radiation. For example, continuous carbon fibers are embedded in a partially cured epoxy such that the extruded component sticks together, but requires a post-cure to fully harden. Similarly, while one embodiment or aspect of the invention use preformed continuous core reinforced filaments, in some embodiments, the continuous core reinforced filament may be formed by combining a resin matrix and a solid continuous core in a heated extrusion nozzle. The resin matrix and the solid continuous core are able to be combined without the formation of voids along the interface due to the ease with which the resin wets the continuous perimeter of the solid core as compared to the multiple interfaces in a multistrand core. Therefore, such an embodiment may be of particular use where it is desirable to alter the properties of the deposited material.

FIGS. 2A and 2B depict a hybrid system employing stereolithography (and/or selective laser sintering) to provide the matrix about the embedded fiber, i.e. processes in which a continuous resin in liquid or powder form is solidified layer by layer by sweeping a focused radiation curing beam (laser, UV) in desired layer configurations. In order to provide increased strength as well as the functionalities associated with different types of continuous core filaments including both solid and multistrand materials, the stereolithography process associated with the deposition of each layer can be modified into a two-step process that enables construction of composite components including continuous core filaments in desired locations and directions. A continuous core or fiber may be deposited in a desired location and direction within a layer to be printed, either completely or partially submerged in the resin. After the continuous fiber is deposited in the desired location and direction, the adjoining resin is cured to harden around the fiber. This may either be done as the continuous fiber is deposited, or it may be done after the continuous fiber has been deposited. In one embodiment, the entire layer is printed with a single continuous fiber without the need to cut the continuous fiber. In other embodiments, reinforcing fibers may be provided in different sections of the printed layer with different orientations. In order to facilitate depositing the continuous fiber in multiple locations and directions, the continuous fiber may be terminated using a cutter as described herein, or by the laser that is used to harden the resin.

FIG. 2B depicts a part 1600 being built on a platen 1602 using stereolithography or selective layer sintering. The part 1600 is immersed in a liquid resin (photopolymer) material 1604 contained in a tray 1606. During formation of the part 1600, the platen 1602 is moved by a layer thickness to sequentially lower after the formation of each layer to keep the part 1600 submerged. During the formation of each layer, a continuous core filament 1608 is fed through a conduit nozzle 1610 and deposited onto the part 1600. The conduit nozzle 1610 is controlled to deposit the continuous core filament 1608 in a desired location as well as a desired direction within the layer being formed. The feed rate of the continuous core filament 1608 may be equal to the speed of the conduit nozzle 1610 to avoid disturbing the already deposited continuous core filaments. As the continuous core filament 1608 is deposited, appropriate electromagnetic radiation (e.g., laser 1612) cures the resin surrounding the continuous core filament 1608 in a location 1614 behind the path of travel of the conduit nozzle 1610. The distance between the location 1614 and the conduit nozzle 1610 may be selected to allow the continuous core filament to be completely submerged within the liquid resin prior to curing. The laser is generated by a source 1616 and is directed by a controllable mirror 1618. The three dimensional printer also includes a cutter 1620 to enable the termination of the continuous core filament as noted above.

Optionally, the deposited filament is held in place by one or more "tacks", which are a sufficient amount of hardened resin material that holds the continuous core filament in position while additional core material is deposited. As depicted in FIG. 2C, the continuous core filament 1608 is tacked in place at multiple discrete points 1622 by the laser 1612 as the continuous core filament is deposited by a nozzle, not depicted. After depositing a portion, or all, of the continuous core filament 1608, the laser 1612 is directed along a predetermined pattern to cure the liquid resin material 1604 and form the current layer. Similar to the above system, appropriate electromagnetic radiation (e.g., laser 1612), is generated by a source 1616 and directed by a controllable mirror 1618. The balance of the material can be cured to maximize cross linking between adjacent strands is maximized, e.g., when a sufficient number of strands has been deposited onto a layer and tacked in place, the resin may be cured in beads that are perpendicular to the direction of the deposited strands of continuous core filament. Curing the resin in a direction perpendicular to the deposited strands may provide increased bonding between adjacent strands to improve the part strength in a direction perpendicular to the direction of the deposited strands of continuous core filament. If separate portions of the layer include strands of continuous core filament oriented in different directions, the cure pattern may include lines that are perpendicular or parallel to the direction of the strands of continuous fibers core material in each portion of the layer.

Figure 3:
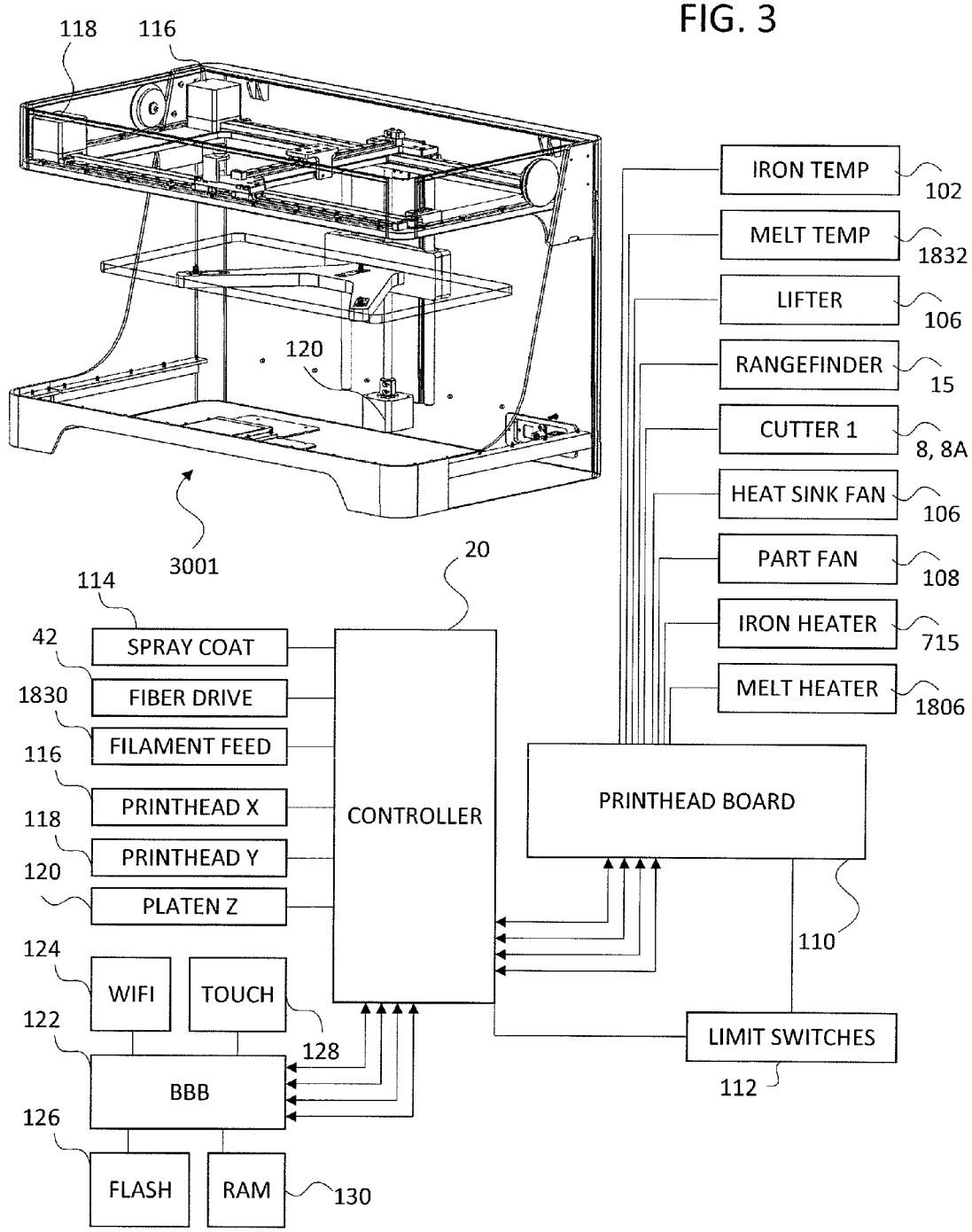
FIG. 3 is a block diagram and schematic representation of a three dimensional printer capable of printing with the compound extrusion and fiber printhead assembly of FIG. 1C.

FIG. 3 depicts a block diagram and control system of the three dimensional printer which controls the mechanisms, sensors, and actuators therein, and executes instructions to perform the control profiles depicted in and processes herein. A printer is depicted in schematic form to show possible configurations of three commanded motors 116, 118, and 120. It should be noted that this printer may include the compound assembly of printheads 199, 1800 depicted in FIG. 1C.

As depicted in FIG. 3, the three-dimensional printer 3001 includes a controller 20 which is operatively connected to the fiber head heater 715, the fiber filament drive 42 and the plurality of actuators 116, 118, 120, wherein the controller 20 executes instructions which cause the filament drive to hold an unattached terminal end of the composite filament 2 in the cold feed zone 712 between the fiber filament drive 42 and the ironing tip 726. The instructions are held in flash memory and executed in RAM (not shown; may be embedded in the controller 20). An actuator 114 for applying a spray coat, as discussed herein, may also be connected to the controller 20. In addition to the fiber drive 42, a filament feed 1830 be controlled by the controller to supply the extrusion printhead 1800. A printhead board 110, optionally mounted on the compound printhead 199, 1800 and moving therewith and connected to the main controller 20 via ribbon cable, breaks out certain inputs and outputs. The temperature of the ironing tip 726 may be monitored by the controller 20 by a thermistor or thermocouple 102; and the temperature of the heater block holding nozzle 1802 of any companion extrusion printhead 1800 may be measured by a thermistor or thermocouple 1832. A heater 715 for heating the ironing tip 726 and a heater 1806 for heating the extrusion nozzle 1802 are controlled by the controller 20. A heat sink fan 106 and a part fan 108, each for cooling, may be shared between the printheads 199, 1800 and controlled by the controller 20. Rangefinder 15 is also monitored by the controller 20. The cutter 8 actuator, which may be a servomotor, a solenoid, or equivalent, is also operatively connected. A lifter motor for lifting one or either printhead 199, 1800 away from the part (e.g., to control dripping) may also be controlled. Limit switches 112 for detecting when the actuators 116, 118, 120 have reached the end of their proper travel range are also monitored by the controller 20.

As depicted in FIG. 3, an additional breakout board 122, which may include a separate microcontroller, provides user interface and connectivity to the controller 20. An 802.11 Wi-Fi transceiver connects the controller to a local wireless network and to the Internet at large and sends and receives remote inputs, commands, and control parameters. A touch screen display panel 128 provides user feedback and accepts inputs, commands, and control parameters from the user. Flash memory 126 and RAM 130 store programs and active instructions for the user interface microcontroller and the controller 20.

Figure 4:
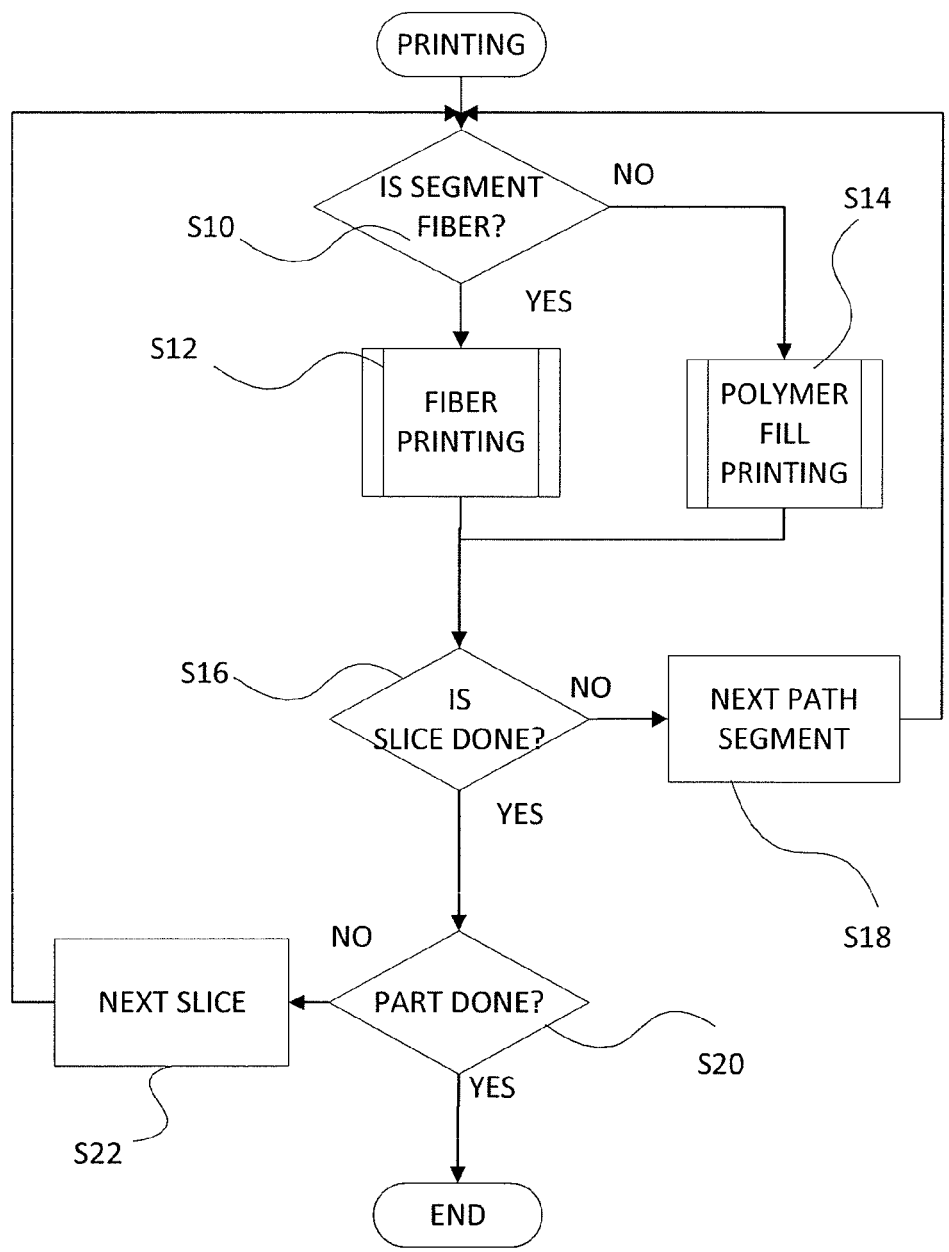
FIG. 4 is a flow chart describing the overall operation of the 3D printer of FIG. 3.

FIG. 4 depicts a flowchart showing a printing operation of the printers 1000 in FIGS. 1-3. FIG. 4 describes, as a coupled functionality, control routines that may be carried out to alternately and in combination use the co-mounted FFF extrusion head 1800 and fiber reinforced filament printing head 199 of FIG. 1C.

Figure 11A:
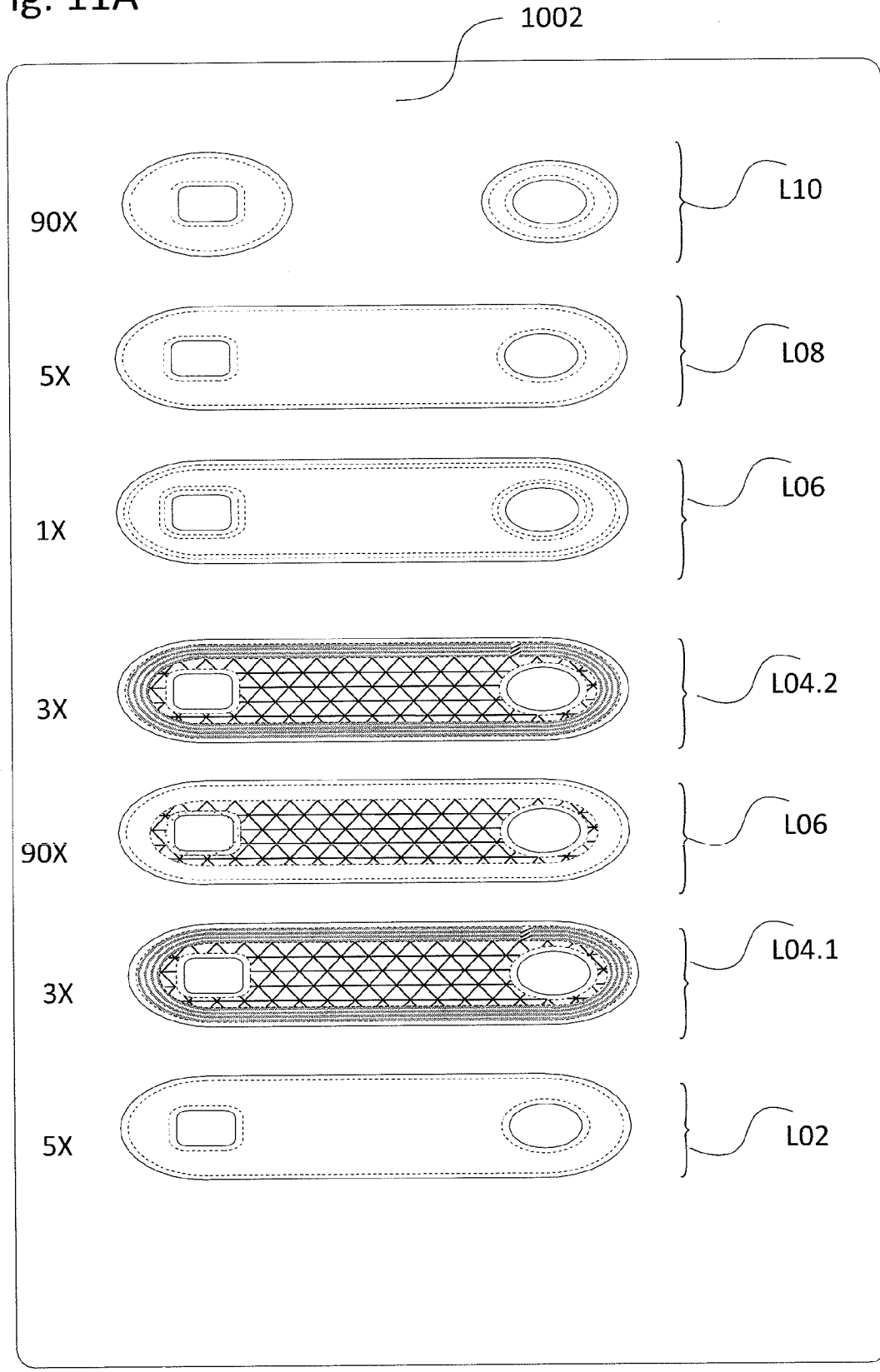
FIGS. 11A-11C show models, renderings, representations of toolpaths, and data structures as carried out by the part rendering and logic structure of FIG. 10A, for a sandwich panel rule example.
Figure 11B:
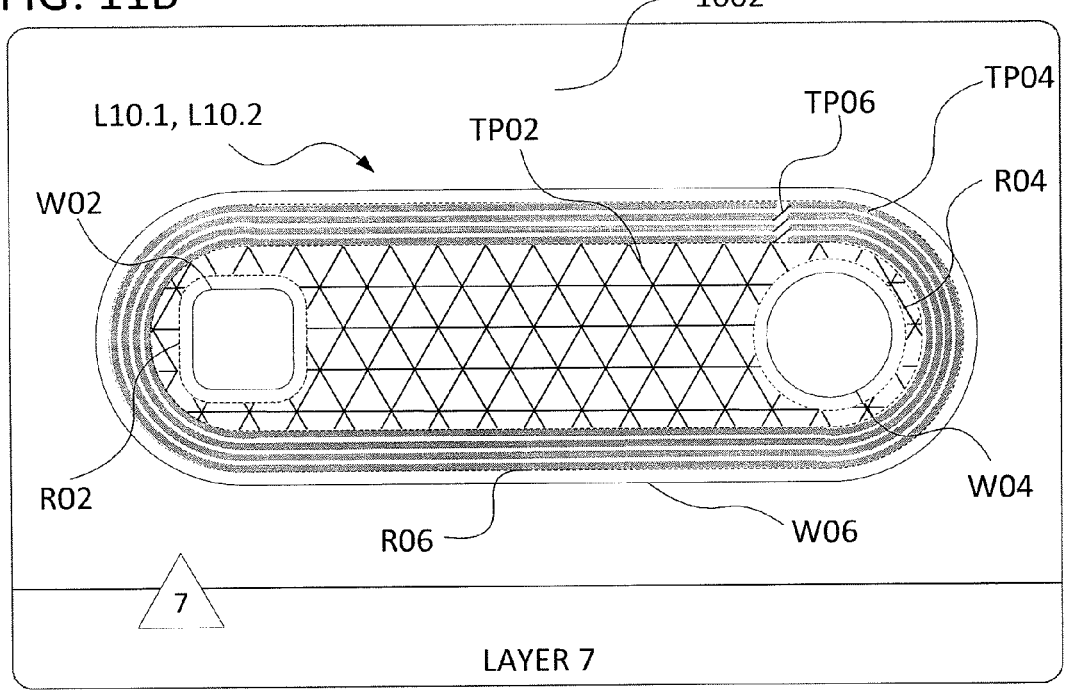

In FIG. 4, at the initiation of printing, the controller 20 determines in step S10 whether the next segment to be printed is a fiber segment or not, and routes the process to S12 in the case of a fiber filament segment to be printed and to step S14 in the case of other segments, including e.g., base, fill, or coatings. Step S12 is described in detail with reference to FIGS. 2 and 12. After each or either of routines S12 and S14 have completed a segment, the routine of FIG. 11 checks for slice completion at step S16, and if segments remain within the slice, increments to the next planned segment and continues the determination and printing of fiber segments and/or non-fiber segments at step S18. Similarly, after slice completion at step S16, if slices remain at step S20, the routine increments at step S22 to the next planned slice and continues the determination and printing of fiber segments and/or non-fiber segments. "Segment" as used herein corresponds to "toolpath" and "trajectory", and means a linear row, road, or rank having a beginning and an end, which may be open or closed, a line, a loop, curved, straight, etc. A segment begins when a printhead begins a continuous deposit of material, and terminates when the printhead stops depositing. A "slice" is a single layer or lamina to be printed in the 3D printer, and a slice may include one segment, many segments, lattice fill of cells, different materials, and/or a combination of fiber-embedded filament segments and pure polymer segments. A "part" includes a plurality of slices to build up the part. FIG. 12's control routine permits dual-mode printing with two different printheads, including the compound printheads 199, 1800 of FIG. 1C, and using both timing approaches of FIG. 5.

Figure 5:
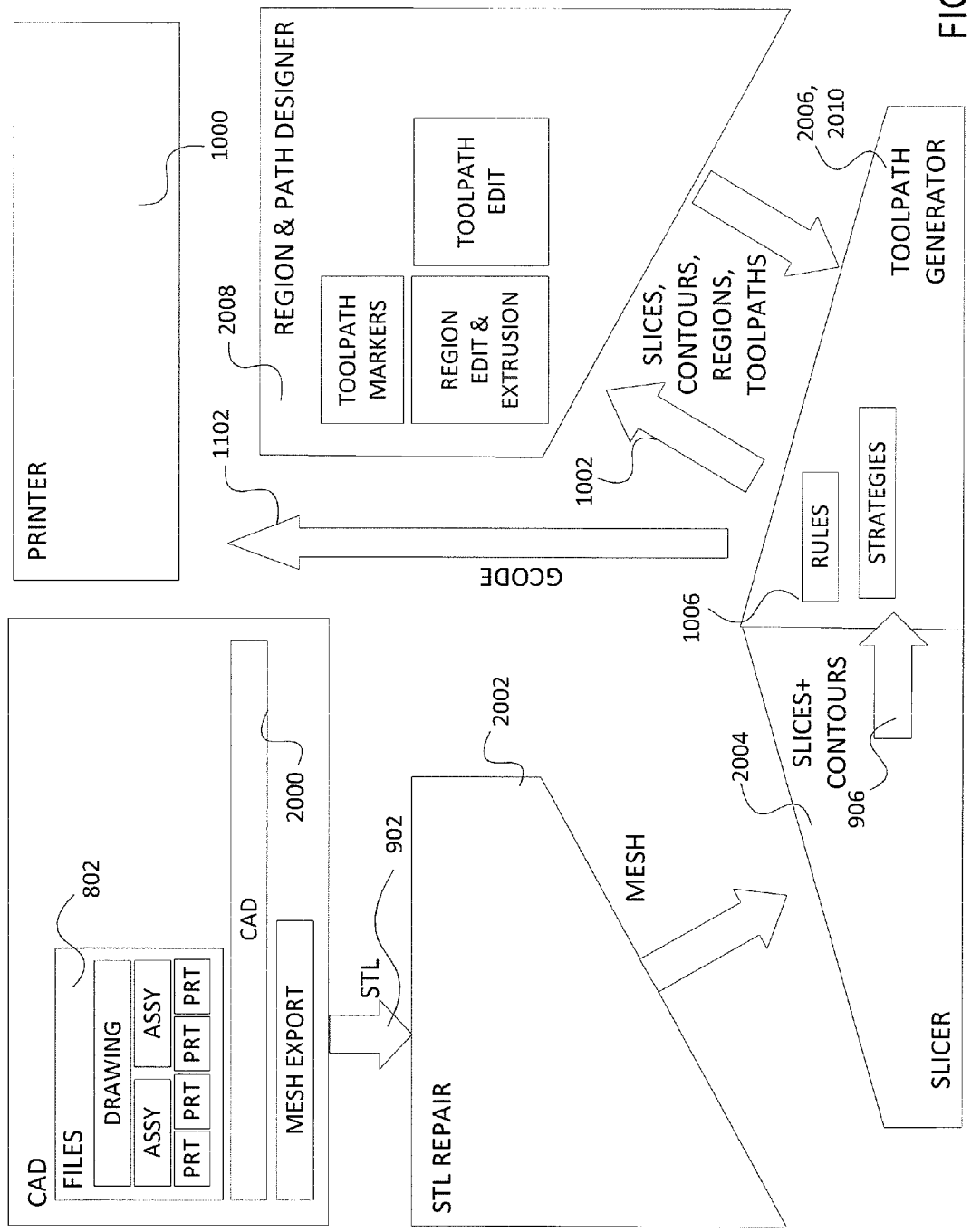
FIG. 5 is a block diagram and schematic representation of a three dimensional printer system, including a CAD station, a slicer and path generator, a region and path designer, and the three dimensional printer.
Figure 6:
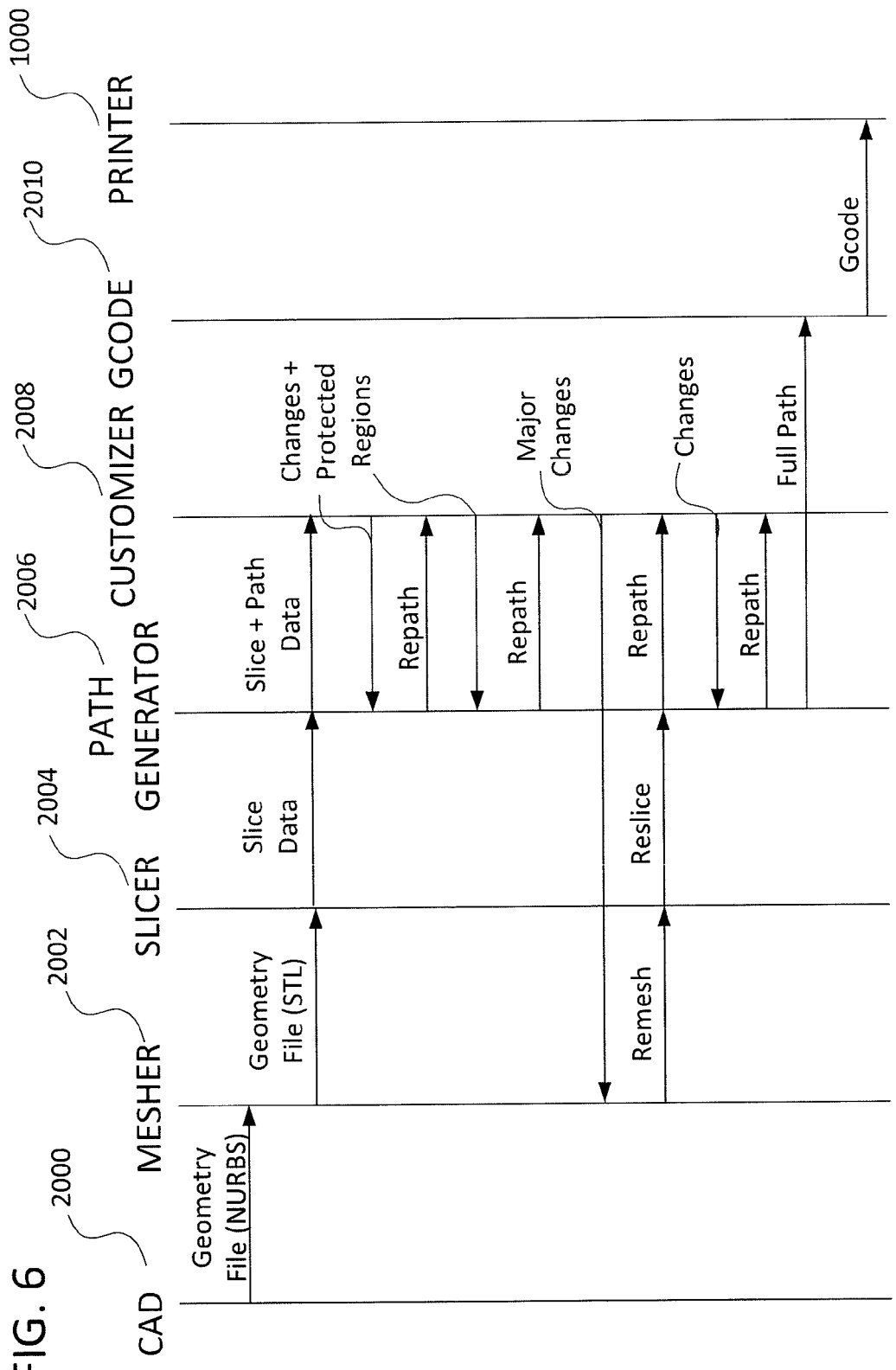
FIG. 6 is a call diagram depicting an exchange of data structures among elements of the three dimensional printer system.

FIG. 5 depicts a block diagram of a three dimensional printer system, including devices in the system and relevant databases, data structures, control messages, and file formats which cooperate to control the printers of FIGS. 1-3 and as described throughout. FIG. 6 depicts a call diagram in which data types and operations are related and communicated between devices.

As shown in FIGS. 5 and 6, in order to construct a part using a 3D printer 1000, the process usually begins with a solid model corresponding to a part ("PRT") of interest represented by a data structure ("files" 802, having a drawing container DWG with assemblies "ASSY" comprising various parts "PRT"), but may also begin with a polygon mesh of the desired part (STL 902 in FIG. 3). As shown in FIGS. 5 and 6, the solid model may be represented by non-uniform rational b-spline NURBS data, and this may be stored and processed by a CAD program on a workstation, server, or virtualized/cloud server 2000, and communicated by file or data structure to a meshing program on the same or a different workstation, server, or virtualized/cloud server 2000. One of the data structures most amenable to division into layers for additive manufacturing is the surface mesh of cells or polygons having edges, faces and vertices stored as a geometry file (e.g., STL, OBJ, PLY, AMF or WRL file). As used herein, "geometry file" and/or "STL" 902 are used generically and interchangeably to mean data structures (including groups of files) inclusive of both surface meshes and CAD solid model representations that use techniques other than surface meshing (e.g., a "NURBS" definition).

In preparation for 3D printing, a geometry file is "sliced" by a family of slicer routines 904 (as shown in FIGS. 5 and 6, resident on a workstation, server, or virtualized/cloud server) in a direction parallel to the expected build platen to create a series of layers or lamina ("Empty Deck" 906).— receives the geometry file. Geometry files are usually without material definition, and each individual lamina would be initially treated as of homogenous or isotropic material properties. Alternatively, one embodiment of a geometry file 902 may include markers, boundaries, sub-geometries, divisions, boundary conditions, or the like specifying a different material property according to volumetric location within the geometry file.

Subsequently, for each layer, toolpaths ("layers and slices" 1002) are calculated by a path planner 1004 for controlling actuators to deposit, focus a laser or lamp or projector to cure, solidify, or otherwise apply material. As shown in FIGS. 5 and 6, the toolpath generator is also resident on a workstation, server, or virtualized/cloud server. In the present discussion, "toolpath" encompasses both moving a tool through space and pure electromagnetic paths (e.g., optical, radiation) "moved" with mirrors and lenses. Toolpaths may be arranged within contours, which may subdivide a layer perimeter into areas of different attention, e.g., where a larger or smaller deposition head is necessary to reach some part of the lamina geometry, or to observe rule sets 1006 for different parts of the layer (e.g., walls, interior perimeter, fills). Toolpaths are generated per internal algorithms that determine offsets, scales, and cellular decomposition for complete coverage approaches of the various contours. Some parameter control may be applied to the rules 1006 (e.g., an adjustable 1-5 thicknesses of deposited plastic for an outer perimeter forming rule).

An FFF toolpath may have variables including extrusion width (relating to the nozzle size, nozzle height from build surface, and extrusion speed). Other deposition toolpaths in additive manufacturing may have variables similarly relevant to the physics and chemistry of the individual process.

As shown in FIGS. 5 and 6, a customizer routine 2008 (permitting one or both of automated and manual editing) may permit changes to the generated toolpaths, regions or subcontours, contours, layers, and mesh. Some customizations may require merely re-pathing, others may create new regions, others may create new geometry model sections— these changes may be done as they are entered by a user, or may be batched and redone. Optionally, after all customizations are done, the process is returned to the earliest practical phase with all changes protected to be re-meshed, re-sliced, or re-pathed.

As sent to the 3D printer 2000, the toolpaths are used to create an instruction file for actuation, conventionally called a "G-code" file or stream 1102. The toolpath generator 2006 generates toolpaths may also serve as the G-code generator 2010 by interpreting the toolpaths into a machine-specific code. The G-code is sequenced including all starting and finishing times, control or command variables (e.g., speed for a motor, current for a heater), and the like, to arrange the actuator instructions sufficient for a job to complete. The G-code 1002 file, because it is dependent upon physical arrangement of the printer itself, is typically printer specific.

This process—slicing, then generating toolpaths, then generating G-code—whether used for conventional additive or subtractive manufacturing, does not include any provision for, the unique characteristics of embedded and/or reinforcing continuous or semi-continuous fiber—i.e. anisotropic characteristics including stress, strain, thermal conductivity, load and support direction specific design, or the like.

FIGS. 5 and 6 for the purpose of reference terms throughout, show a series of steps in the data structure, each of which is optionally combined with an adjacent step. As shown in FIGS. 5 and 6, a reference part as stored in a CAD geometry file includes a definition of exterior walls, upward facing "floors" and downward facing "ceilings", interior "roofs", interior through-holes, and interior "solid" spaces.

As shown in FIGS. 5 and 6, when converted into an STL, the 3D data structure is transformed into a geometry mesh defining only the exterior perimeter, but retains all of the characteristics of the more complex CAD representation. As noted, this is optional, as the mesh representation is easier to "slice". Defective, non-"watertight" or non-manifold STLs may be repaired such that all vertices are properly connected, but the representation as a mesh remains essentially similar.

As shown in FIGS. 5 and 6, "slicing" the STL includes two conceptual steps, which are often done together. First, at each height increment, a cross-section must be taken through the STL parallel to the anticipated build platen orientation. Second, necessary toolpaths are expressed as G-code for a deposition head to deposit material along the exterior interior perimeters of the slice and also to create any interior structures (such as fills). The toolpaths and G-code may be generated at each slicing operation, such that these steps are merged. For the purpose of this discussion, "slicing" will be discussed as set of merged steps in which cross-sectional slices are taken and path planning and G-code are generated for uniform material fill.

As shown in FIGS. 5 and 6, slicing operations identify and use toolpaths to surround exterior and interior lateral walls (e.g., three fused polymer rows at each); fill interior volumes with cellular or lattice structures; form ceilings, floors, and roofs with slower print speeds; and create temporary support structures used during the print cycle. In addition, toolpaths for moving tools from origin to print start to print stop, and for feeding and retracting filament to start and stop extrusion are created.

Figure 7:
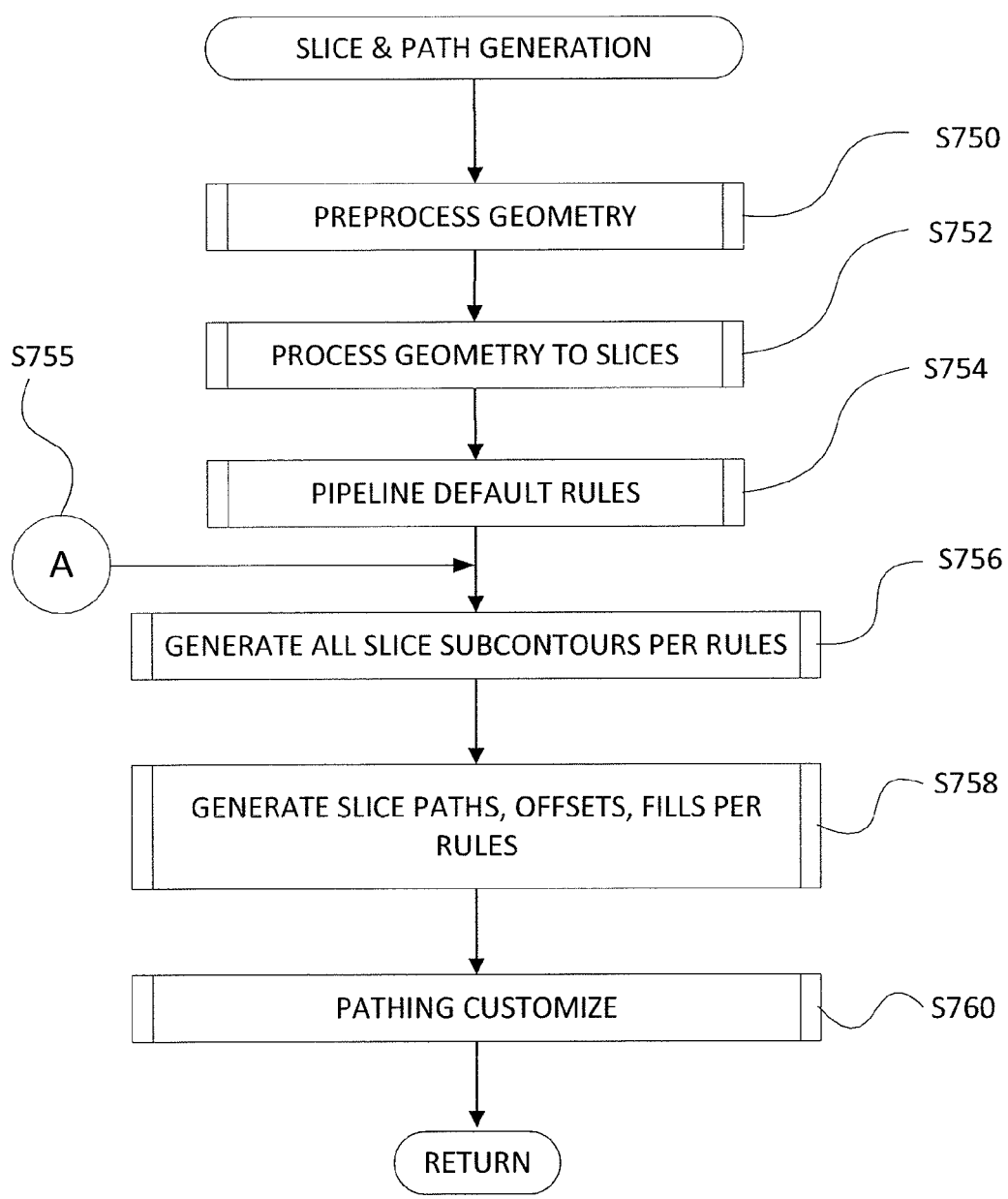
FIG. 7 is a flow chart describing the overall operation of the slicer and path generator of FIG. 4.

FIG. 7 is a flow chart describing the overall operation of path planner, i.e., the slice, contour, subcontour (region) and path generator and planners depicted in FIGS. 5 and 6. The fiber path planner of FIG. 7 receives as an input a "sliced" database of layers from the slicer, in this case referred to as a "sliced stack" or "empty deck". This sliced stack database may be in the form of, per layer, topological information (contours, defined as a solid or a hole via the conventional right hand rule), and/or toolpath information (trajectories), metadata, and/or G-code or an equivalent. For example, one form of subset would include the "SLC" file format or an equivalent, which includes only the geometry of the contours. A superset could include the STL file, or analyses or parameters recognized from the STL file (e.g., a label for a through hole that is shared by code segments generating that through hole in G-Code).

It is a distinction from either or both of conventional additive manufacturing and conventional subtractive manufacturing that the fiber path planner works with individual layers or slices, preferably with many at a time. In the case of conventional additive manufacturing, slicing software.

It should be noted that the initial input for a first pass on a 3D part to be printed, where no layer-by-layer fiber path generation has yet been performed that could be repathed, is the "slices and contours". It is an optional object of the present disclosure to subsequently deal with re-pathing on a database of layers rather than with the 3D model geometry, to thereby only repath those contours and those layers that should be changed. However, the present disclosure further contemplates that in some situations, repathing from an earlier stage may be beneficial (e.g., for Boolean and/or parametric operations supported at the region level, in addition to or in the alternative to at the layered level).

It should be noted that the process of creating toolpaths for ordinary additive manufacturing does not conventionally require repathing, nor is comparison to any but one or two adjacent layers conventionally necessary. Toolpaths/G-code are built up from a platen assumption; material is not extruded in the same location twice; and the tool need not be moved back in the Z direction opposite to the direction of build, even for the case of multi-material or multi-part STLs. Should changes need to be made, the process of generating new tool-paths is generally to redo the part in CAD, create a new STL, and reslice/repath the entire geometry file (STL).

However, in order to edit the interior structure of the part to be printed, including the placement for fiber, at least some repeated operation in toolpath generation is preferred, to accommodate manual or new automatic changes in fiber placement performed by the path planner, or to provide the freedom of designing reinforcing fiber within a part designed on a CAD system with no provision for anisotropic materials.

Accordingly, as noted below, the process of FIG. 7 can be entered with its own output, i.e., the process of FIG. 7 is intended to analyze and change both data sets having only layers and contours, as well as the "slices, contours, regions, and toolpaths" set generated by the toolpath generator and modified in customization, and there are cases in which it may be beneficial to do so (e.g., in case incremental processes are interdependent).

In step S750, the process, in a mesh pre-processing step, corrects the STL file for various errors, including at least one of: correcting face normal orientation; self-intersections; non-manifold geometry and manifold errors; vertices not incident to any edge; edges without any incident triangles; edges with more than two incident triangles; vertices with a non-disc neighborhood; disconnected, or unwanted handles, tunnels, components, or cavities; erroneous holes or cavities; triangles with (near-) zero area. Techniques include merging vertices within a prescribed distance; merging or stitching adjacent boundary edges; clipping then merging overlapping patches; hole filling by inserting vertices; converting mesh into point cloud and remeshing. This step may generate a simplified, more robust, mesh in which each vertex and edge is uniquely defined, and faces are generated from defined vertices and edges.

In step 752, the process slices the (pre-processed or corrected) geometry (e.g., triangle) mesh in to layers, strata, or slices (these terms used interchangeably). Techniques include checking all triangles or groups of proximate triangles vs. all cutting planes for intersections; checking all edges vs. all cutting planes for intersections (sweep plane slicing); or checking all planes for intersections with intervals representative of each triangle. This generates a set of two dimensional slices at a fixed height or variable height (either may be recorded as metadata for a particular slice). The fixed or variable height may be of any thickness/resolution printable by the target 3D printer, e.g., 0.02", 0.01", 0.005", 0.001", 0.1 mm and multiples of these, or even of a lesser thickness/resolution useful for inter or intra-layer insertions. Each slice includes at least one positive contour (e.g., an outer perimeter) and may include one or more negative contours (e.g., a hole or holes). A positive contour may also create a proxy for a hole, e.g., by specifying a perimeter that loops to touch (e.g., meld with) itself to create such hole proxies(s).

Figure 21:
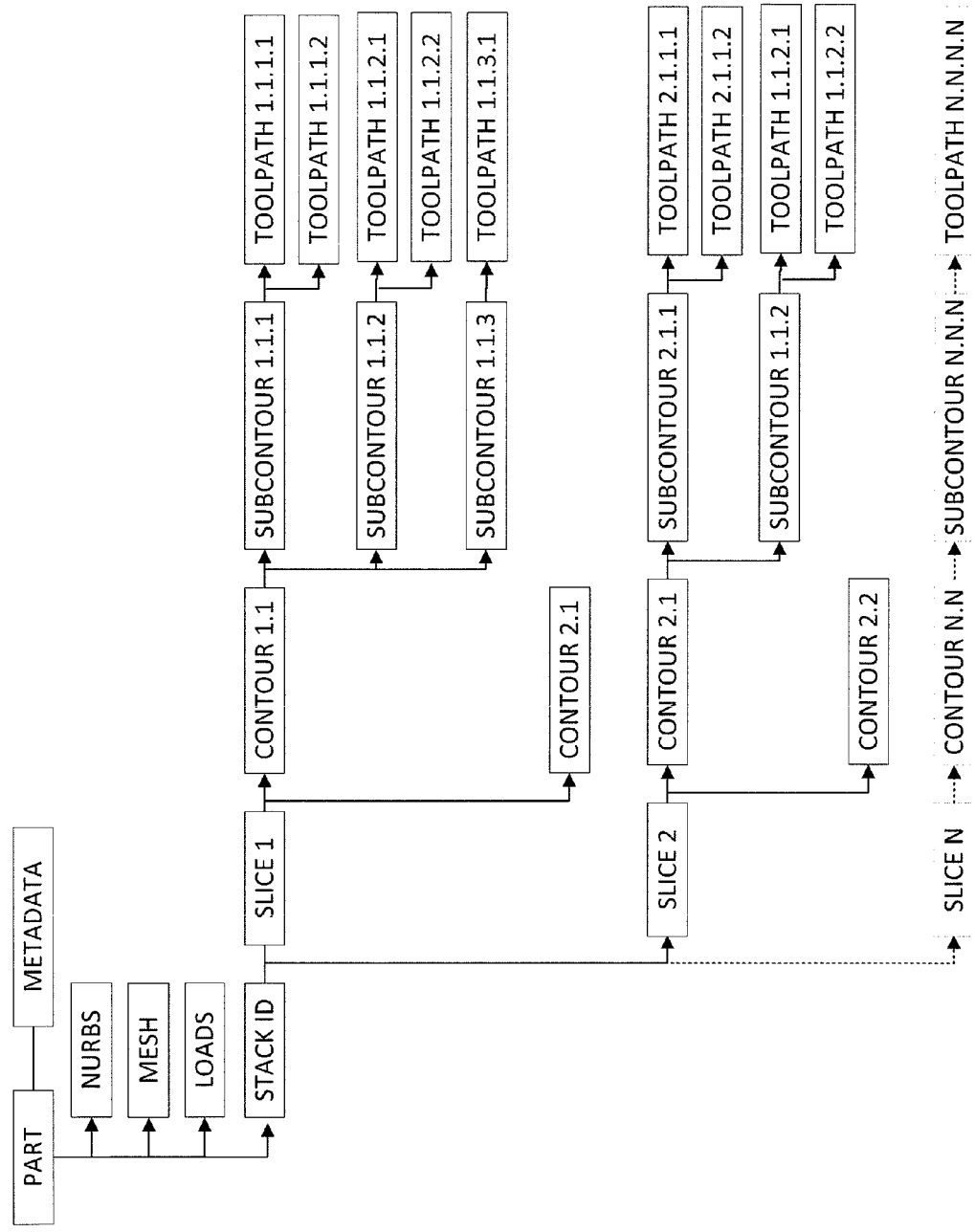
FIG. 21 shows an exemplary file format for recording the final state after operation of prioritized or ordered rules and parameters for the process of FIG. 8.

In step S754, the process inventories the state of default rules for FFF and fiber printing selected for automated contours and toolpaths, and sets an order of operations for the default rules selected. An exemplary state of such rules are shown in FIGS. 20 and 21 and described with reference thereto. The order of operation of rules may be linear, recursive, or otherwise arranged. A predetermined overall order of operations may interrelate all possible operations. It should be noted that a change in rules (e.g., changing or adding or subtracting a rule) any time during the process may, by interrupt, trigger, commit or otherwise, restart the process at step S755 (entry point "A") to accommodate the change. The user may be afforded an opportunity to modify these default rules before the first execution of step S756 (e.g., skip to step S760).

It should be noted that the creation of internal contours or regions for the operation of a particular rule or application of a particular internal design structure within can take place before, after, or during the operation of the rule or design. Some rules are more amenable to defining a boundary as they operate (e.g., contour-following fills); other rules are more amenable to working with a certain perimeter (e.g., patterned fills such as honeycomb or triangle); still other rules are more amenable to including a required bounding contour as part of their definition (e.g., hole-reinforcing patterns, insert-reinforcing patterns).

Figure 8:
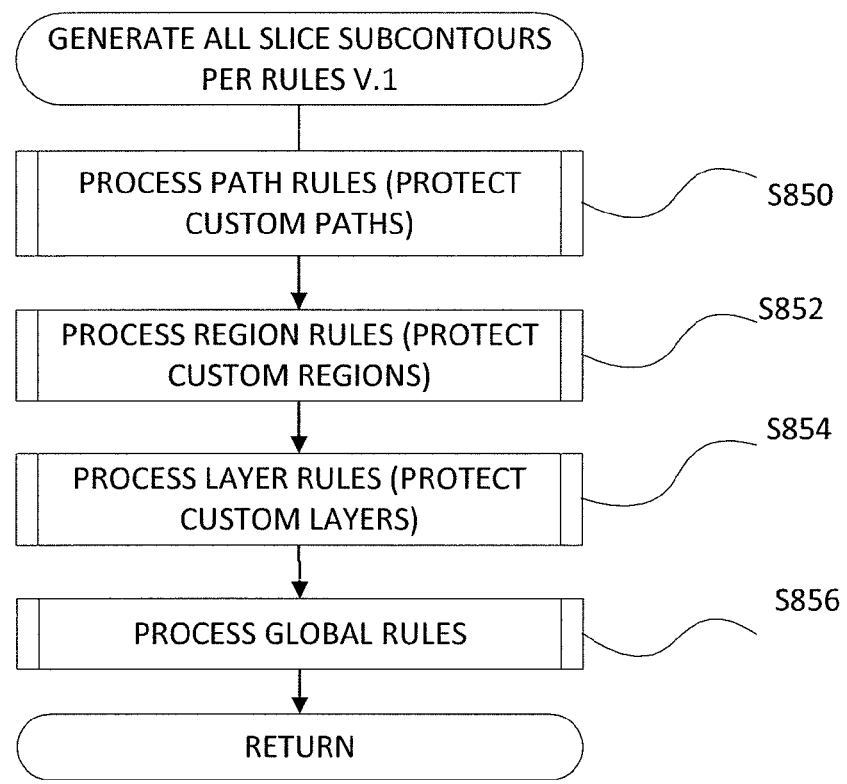
FIG. 8 is are flow chart describing the overall operation of a subcontour or region generator of FIG. 7.

In step S756, the process applies the ruleset, layer by layer, according to the order of operations, to determine sub-contours, i.e., two dimensional topological sub-areas and/or holes within a positive contour, as new dependent positive and/or negative contours. Again, negative contours may form holes, or positive contours may form proxies for holes. In addition, positive contours may be created by ruleset to trigger or force a desired pathing or filling of fiber or material. Sub-contours may have perimeters coincident with an enclosing or neighboring contour, and a positive sub-contour may form a wall of a hole in the layer). FIGS. 8A and 8B include further detail on sub-contour generation.

In step S758, the process applies the ruleset, contour by contour, according to the order of operations, to generate desired toolpaths for filling of fiber or material, as well as transitions therebetween, for one or more fiber laying tools and for one or more material deposition tools. When all paths are generated, the initial printing strategy is complete. At this point the toolpaths may be translated to G-code and the part may be printed, and an end-user may be offered the opportunity to review and/or print the toolpath state or the part (e.g., at the beginning of the customization process).

As discussed herein, a segment, toolpath or path is a sequence of trajectories and contours. A trajectory is a connected sequence of path commands. Toolpath commands may include line segments and partial elliptical arcs, and optionally Bezier curve segments. Each path command may have path coordinates, and a pair of path coordinates may be an X, Y location that is a control point. A contour is a closed trajectory with the same start and end point. Toolpaths are executed (e.g., by a deposition printhead, by laser or UV curing, by flash DLP curing) or rendered (e.g., to display upon a review panel) by "stroking" the path. In the case of a toolhead, the "stroking" may be depositing material or curing material as swept out by a fixed-width deposition centered on the trajectory that travels along the trajectory orthogonal to the trajectory's tangent direction. Stroking may be by area or accumulated (an entire area may be flashed by DLP as a toolpath).

With respect to offsetting of or contours toolpaths discussed herein, parallel or offset toolpaths may be created using offset generation for non-Bezier base paths and offset stroking for Bezier (e.g., cubic or quadratic control point) base paths. Optionally, because offset stroking for Bezier paths may be difficult to render, FFF material or fiber paths may be non-Bezier approximations. Resolution-independent path rendering may be performed by via vector graphic libraries for GPU accelerated path rendering (e.g., OpenVG) even to calculate toolpaths and offsets of physical continuous fiber paths.

In step S760, the process permits the customization, layer by layer, contour by contour, and/or path by path, of the completed toolpath and printing strategy. The customization process is optional, as is each type of customization.

As shown in FIGS. 8A and 8B, subcontours (or "regions") and in some cases toolpaths are generated layer by layer in a priority or order of precedence. Global rules are optionally of lowest precedence, as they are most likely to be overridden by direct user changes (actual design decisions) or indirect user changes (results of design decisions).

The process of FIG. 8A is carried out both initially and in later editing stages. In an initial pass, no user changes of fiber paths or regions/subcontours will have been recorded, so there will be no user edited fiber paths or subcontours to process at highest priority. In this initial pass, the highest priority may be global rules.

Within and among each set of processed rules, higher priority rules, once defining a toolpath and/or region, are generally protected as the next, lower priority set of rules are processed. In the case of a conflict, the user may be given a warning and opportunity to elevate the priority of a nominally lower priority rule. The priority stack may also be considered an order of operations. Higher priority actions are optionally not disturbed by later actions unless a failure mode rule is broken.

While the actual order of priorities may be dependent upon implementation, in one implementation, the general order of rules is: failure mode rules (e.g., limits of the platen or of the tool heads, of unsupported spans of a particular material, etc.); toolpath rules; then subcontour rules; then layer rules; then global rules. In each step, direct edits are or were preferably only permitted in a manner which does not violate (optional) failure mode rules (e.g., another failure mode rule may be that an unsupported spans of isotropic fill material can extend, e.g., no more than 1 cm in length, or other length specified as a property of the material).

In step S850 initially, in any layer in which a toolpath was edited, any manual or automated operation in which a toolpath is or was directly edited by a user is processed by first plotting the related toolpath (and any dependencies) and then defining the envelope which the toolpath occupies, protecting the envelope as a region or subcontour. An example toolpath edit operation is changing the position of control points or waypoints of a curve defining a toolpath.

In optionally subsequent step S852, among all the layers, the regions or subcontours protected in step S850 are now "off limits". Manual or heuristic operations in which a subcontour is or was directly edited by a user are processed by protecting the region or subcontour. Toolpaths may be generated at a later time. An example subcontour edit operation is specifying a void volume (e.g., an solid model to be overmolded) that extends through several layers.

In optionally subsequent step S854, layer rules (i.e., rules that have been set for an entire layer) are processed. Regions or subcontours protected in prior steps are now "off limits". Manual or heuristic operations in which a layer is or was directly edited by a user are processed by protecting all remaining regions or subcontours in the layer. Toolpaths may be generated at a later time. An example layer edit operation is specifying that fiber fill will be used on a particular layer that had not by toolpath, subcontour or global rules otherwise been defined as a fiber layer.

In step S856, global rules (i.e., rules that have been set for the entire part) are processed. Typical global rules are shown in a priority stack in FIG. 8C, e.g., with wall thicknesses of highest priority and infill of lowest priority. Some or all global rules may optionally or alternatively take precedence over other rules.

Figure 9:
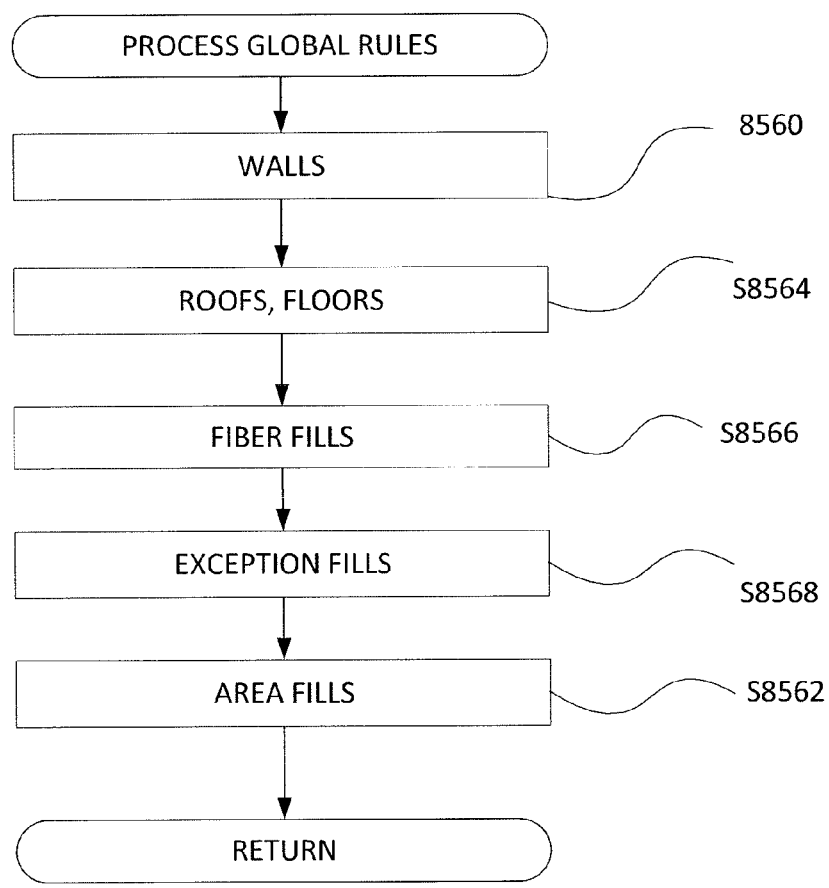
FIG. 9 is a flow chart describing processing of global rules in FIG. 8.

FIG. 9 is a flow chart in which different types of global rule are executed. As noted, although FIG. 9 may take place after the other routines of the slicing and path planning process (or at lower priority), the user may be presented with the results of FIG. 9's processing of default and global rules before any customizations are made or processes. As noted, a later path, region, layer, or volume customization that deposits fiber or other second material at a wall, floor, roof, fiber fill region, exception fill region, or area fill region may optionally (e.g., set by a parameter) override the global wall thickness setting; and each successive toolpaths generation defines regions in each layer which are nominally protected vs. later toolpath generation.

In step S8560, the process of FIG. 9 refers to database settings for wall thicknesses and generates toolpaths corresponding to the walls of the part. Walls may be the perimeters of contours, subcontours, or regions. A typical global setting may be from 2-4 bonded ranks; inner walls (holes) and outer walls (shells) may have different global or default settings.

In step S8562, the routine generates "roofs" and "floors" according to a set parameter (e.g., independently settable at a default 3 layers of any of 1-5 layers, or as a thickness for variable thickness layers). A roof is an external surface facing "up" (i.e., the direction in which layers are built), a floor is an external surface facing "down" (opposite to up).

Figure 10B:
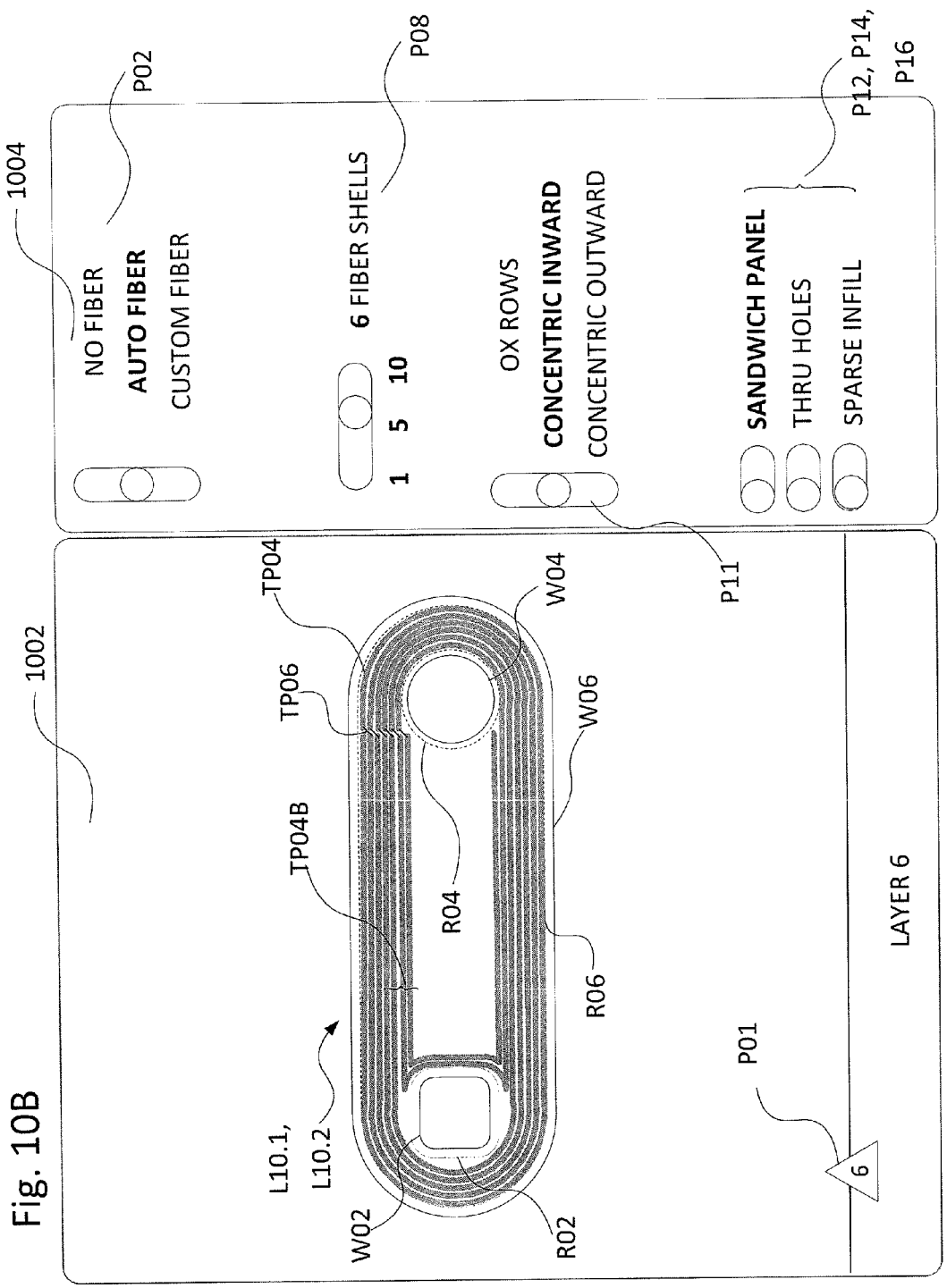
FIG. 10B shows an exemplary on-screen part rendering and logic structure for the rule processing of FIG. 9 for layer operations.
Figure 11C:
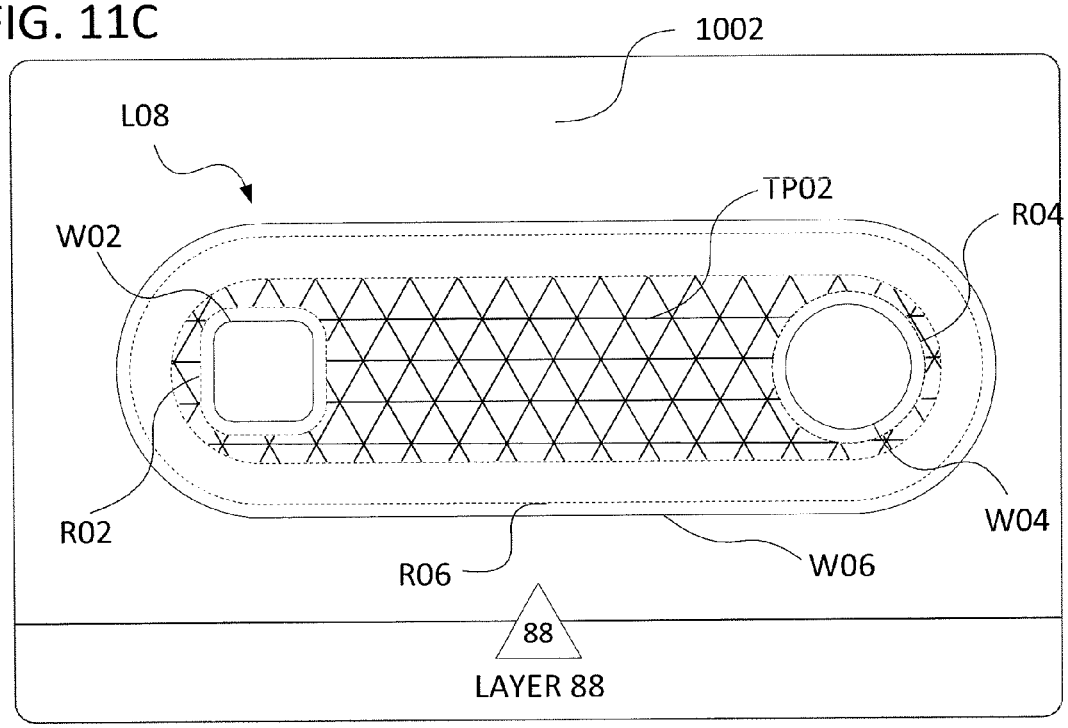
Figure 12:
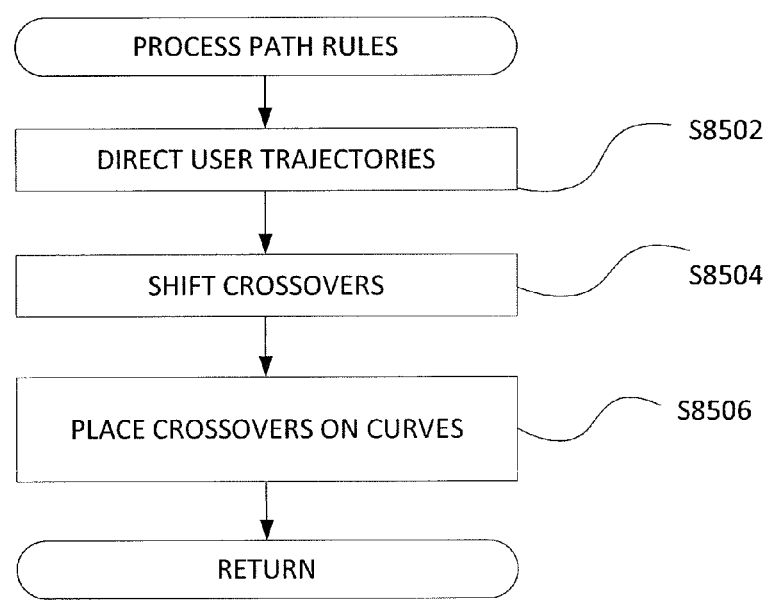
FIG. 12 is a flow chart describing processing of path rules in FIG. 8.

In step S8562, the routine generates fiber fills according to global rules discussed herein with respect to FIGS. 10 through 11C.

FIG. 10 shows an exemplary on-screen part rendering and logic structure for the rule processing of FIG. 9. A view panel 1002 includes an on-screen rendering of a geometry file retained in memory or other database. The geometry file rendered in the view panel 1002 may be shown in different views (e.g., isometric, perspective, orthogonal), and/or in different sections, and/or with or without layers, contours, regions or toolpaths rendered within. Examples include an isometric model shown in FIG. 10; an exploded view of layers shown in FIG. 11A, a "layer at a time" plan view with a layer number control slider shown in FIGS. 11B and 11C. In each view, occluded toolpaths or surfaces may be hidden or shown, and rendered lines and surfaces may be rendered with selective color and transparency as set by the user. Contour, region, layer, fill, material, and other metadata corresponding to a characteristic may be rendered in outline and/or highlighted with selective color and transparency as set by the user.

A selection panel 1004 includes a set of user interface elements that correspond to command flags, arrays, and lists stored in memory or other database (e.g., as shown in FIGS. 20 and/or 21). As disclosed herein, whether or not particularly disclosed separately in discussion of data structures, each on-screen rendering corresponds to that data structure discussed herein necessary to render the view, and each view panel and selection panel user interface element corresponds to a respective flag, array, or list retained in a database in like form to those particularly detailed.

Exemplary global rules that control path planning for each layer that are available to the path planner, and also available to a display renderer for the view panel and a controls renderer for the selection panel, are shown in the view panel 1004. Numbering for features rendered in the view panel 1004 may reference any of FIG. 10 (display), FIG. 9 (process control), FIGS. 20 and/or 21 (rule sets and data structures), as each are related as the data structures defining operations and the part are created and changed by process control according to rule sets and priorities, and the results of the changes displayed to the user. Several available choices are not depicted in FIG. 10, although these would appear in an available view panel. For example, the user may select (and the path planner thereby execute) the thickness of and/or number of bonded ranks forming inner and/or outer walls or shells, the thickness and/or number of bonded layers for floors and/or roof dense or watertight fills; whether or not to use peelable and/or solid supports for printing overhangs; and/or a fill pattern (triangle, hex, square, cellular) for infill of inner areas for weight reduction. Generally, many more parameters may be set by presenting a configuration file (e.g., layer thickness and/or bonded row width; variable feedrate for curves, bends, or outer/inner walls; bridging (printing unsupported spans) lengths for neat plastic or fiber; or limitations for printing spurs (single walled sections).

As shown in FIG. 10, at the global level, the user may choose to "use fiber" as a parameter P02, where a "use" setting permits global, path, layer, and region fiber reinforcement, a "no fiber" setting suppresses all fiber reinforcement, and a "custom" setting permits only path, layer, or region determined fiber reinforcement. The user may specify a parameter P06 as a number of immediately adjacent fiber layers, and a parameter P08 as a number of immediately adjacent fiber shells or ranks, for global fiber operations (which optionally becomes the initial setting for any path, layer, or regions setting). The user may set a parameter P04 as a type of fiber (e.g., carbon fiber, aramid fiber, or fiberglass).

The exemplary model M01 shown in FIG. 10 to receive the operations of the rulesets and ultimately to be printed is a connecting rod including a torque transmitting feature F02 including a polygonal hole/spline surrounded by a large reinforcing circular mount, a slip fit feature F04 including a cylindrical through hole surrounded by a smaller reinforcing circular mount, and an arm feature F06 spanning the two features F02 and F06. "Spanning" herein means extending beyond the lateral or lengthwise extent of one or two features, e.g., a span length F08 extends past the edges of the hole features F02 and F04, is longer than the outer edge-to-edge length.

Detail settings that may be set at a global level also include (i) a parameter for false/dense/lean migrate or stagger for sets of fiber crossovers, which for adjacent layers moves the location of a group of crossovers between adjacent offsets so that crossovers are concentrated in zones or spread out as desired; (ii) a parameter for curves/straightaways for the preferred location of fiber crossovers; or (iii) a parameter for higher or lower moment of inertia, to concentrate fiber to the perimeters or center of a part.

FIG. 11A-11C shows an exemplary display on the view panel 1002, and is generated by rendering to screen 2D definitions (optionally presented in 3D) of contours, sub-contours, and toolpaths, with optional processing for occlusion and showing and hiding particular feature types. In FIGS. 11A-11C and in like representations described in this specification, Regions/subcontours may be shown with dotted lines; fiber toolpaths with grayscale, wider lines; and matrix or resin fill toolpaths with solid lines (excepting short segments extending between fiber toolpaths, which represent crossovers). In some a toolpath may represent either resin/material fill or fiber (e.g., for honeycomb, triangular, or other volumetric sparse fill).

FIGS. 11A-11C also corresponds to the toolpaths generated by the operation of FIG. 10 (display), FIG. 9 (process control), FIGS. 20 and 21 (rule sets and data structures). As defined by contours, subcontours, and toolpaths, the exemplary part as initially configured to be printed represents a layer definition of slicing to the path generator, a display on the view panel; a definition of contours, subcontours/regions; and a definition of a subset of toolpaths. In FIG. 11A and similar figures, a notation with "X" indicates a layer is repeated (possibly through a cycle of complementary layer patterns) that number of times, e.g., "90×" means 90 adjacent layers forming a set.

Fiber reinforcement strategies, which may in some cases be used in combination and which may have sub-strategies, include Concentric Inward, Boustrophedon (ox rows), Concentric Outward, or Sandwich Panel.

Concentric fill is performed within a layer by first obtaining 80-105% (preferably 85-99%) fiber-width offsets from an outer perimeter of a region of the layer. That is, the offsets form concentric paths that are 80-105% (preferably 85-99%) of the fiber-width as laid. One advantageous globally set region is the non-wall region adjacent a shell or wall thickness region (e.g., 1-3 bonded ranks thick). Fiber is deposited by controlling the deposition head to stroke the center of the concentric fiber fill offsets. When the offset has been looped, an S-shaped crossover lays fiber into the neighboring offset. Concentric fill is suitable for bending and tension in particular, and is efficient (fewer turns) as well as inherently strong (no fiber separation permits more force to be transmitted and distributed along the fiber length). As a global setting, concentric fiber fill may be set to be adjacent a floor and or a roof, and/or at a set number of layers from the top and/or bottom of the part. Concentric fill may have no particular orientation, as its direction depends on the perimeter of the part. Optionally, the concentric fill algorithm may be used for other strategies (e.g., for surrounding holes or hole splines for reinforcement). As noted, other settings can be used in combination to, e.g., migrate the crossover between layers, locate crossovers in a particular place, or repeat or vary concentric fill patterns.

Ox-row fill or Raster fill is performed in back and forth rows. U.S. Pat. No. 6,934,600, herein incorporated by reference in its entirety, discloses various implementations of raster fill for nanotube impregnated three dimensional printing. Ox-row fill is performed by specifying an orientation of rows (e.g., lengthwise, widthwise, or at a specified angle) and a region. One advantageous globally set region is again a non-wall region adjacent a shell or wall thickness region. Parallel straight rows, offset by 80-105% (preferably 85-99%) of the fiber width as laid, are calculated side by side traversing the region. If a cutter is available sufficiently close to the tip of the deposition head, the fibers may be cut at each turn. However, a boustrophedon path is optional. Boustrophedon paths can be connected at end rows by 180 degree curved fiber paths of the same diameter as the offset, or by folded paths of two right angles (these may alternate). Fiber is again deposited by controlling the deposition head to stroke the center of the concentric fiber fill offsets. When the offset has been looped, an S-shaped crossover lays fiber into the neighboring offset. As a global setting, ox-row fiber fill may be set to be adjacent a floor and or a roof, and/or at a set number of layers from the top and/or bottom of the part. Ox-row fill may be set to substantially repeat a direction of fill (for increased cumulative strength in that direction, or to provide arbitrary or predetermined patterns of two, three, four or more varying directions to increase multi-directional strength (e.g., 90-90 would represent two adjacent 90 degree perpendicular layers; 60-60-60 three adjacent layers each rotated 60 degrees, 45-45-45-45 four layers following a repeating pattern of reinforcing crisscrossing layers).

Figure 18:
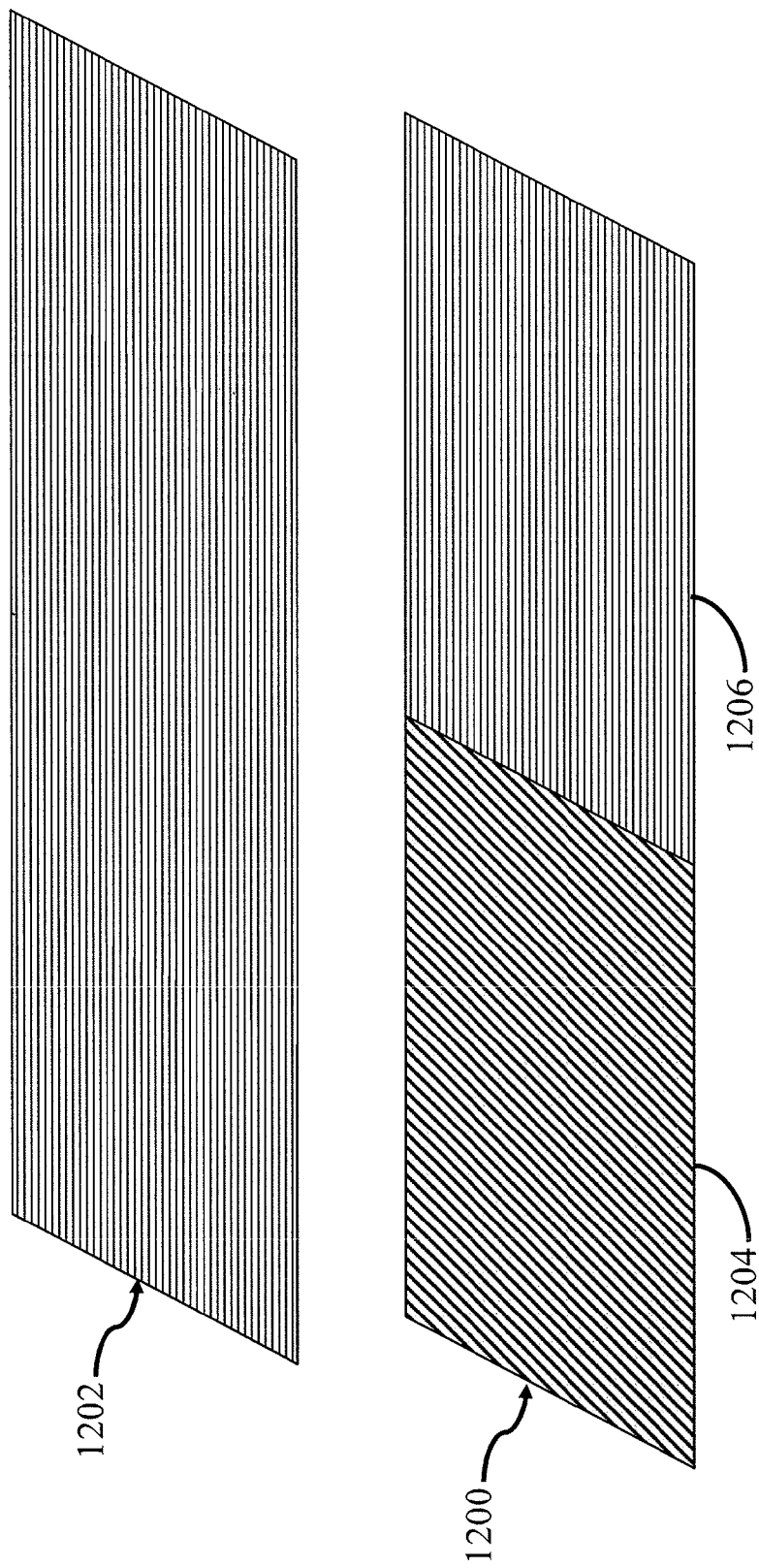
FIG. 18 shows exemplary composite layup in contrasting directions.

In this regard, successive layers of composite may, like traditional lay-up, be laid down at 0°, 45°, 90°, and other desired angles to provide part strength in multiple directions and to increase the strength-to-weight ratio. The controller 20 may be controlled to deposit the reinforcing fibers with an axial alignment in one or more particular directions and locations. The axial alignment of the reinforcing fibers may be selected for one or more individual sections within a layer, and may also be selected for individual layers. For example, as depicted in FIG. 18 a first layer 1200 may have a first reinforcing fiber orientation and a second layer 1202 may have a second reinforcing fiber orientation. Additionally, a first section 1204 within the first layer 1200, or any other desired layer, may have a fiber orientation that is different than a second section 1206, or any number of other sections, within the same layer.

Concentric fiber outward fill is distinct in from concentric fill in that (i) the fiber loops are offset from an inner perimeter formed by an envelope about features or parts to be spanned, rather than outside in. Otherwise, the description with respect to concentric fill applies as would be understood by one of ordinary skill in the art. Fill is performed within a layer by first determining an interior region to be surrounded, e.g., first obtaining an envelope about two features to be circled. Offsets are generated at 80-105% (preferably 85-99%) fiber-width from an outer perimeter of the envelope. Fiber is deposited by controlling the deposition head to stroke the center of the concentric fiber fill offsets. Any S-shaped crossovers may be concentrated on the lengthwise ends, i.e., the curves. of the loops. Alternatively, a "spiral" offset of linearly increasing offset distance may be used to avoid cross-overs, but a spiral offset typically does not fully wrap features such as holes. Optionally, the envelope generation and inner perimeter start may be used for other strategies. Through-hole fill, as an example, may treat each hole as an envelope, and extend the fill from top to bottom of the part, lining a hole along greater than 80 percent of its top-to-bottom length. As noted, other settings can be used in combination to, e.g., migrate the crossover between layers, locate crossovers in a particular place, or repeat or vary concentric fill patterns.

As an example, the embodiment of a part rendered and processed as shown in FIGS. 11A-11C includes, but are not limited to, the operation of the following rules:

(i) concentric fiber fill in the region R08 between the outermost wall region R06 and the neighboring (ii) pure polymer triangular infill in the region R10, which is a remainder region (set after the other regions are defined) extending between the limits of the fiber fill region R08 and the negative contour W02, W04 wall regions R02, R04.

(iii) a sandwich panel rule as discussed below, and (iv) a rule to outline lowest roof holes as discussed below, among other rules.

It should be noted that although similar regions in FIGS. 11A-11C and figures of similar appearance are similarly labeled for the purpose of discussion, a region is in most cases recorded a per-layer entity, and may be encoded as associated with other regions, as part of a set, or otherwise.

As defined in a data structure and rendered in FIGS. 11A-11C, beginning at the first printing surface (shown at the bottom in FIG. 11A, but which may be at the top for printing techniques which build down), a layer set L02 includes multiple slices (e.g., 5× slices at 0.1 mm for a 0.5 mm height) through the torque transmitting feature F02 and slip fit feature F04 shown in FIG. 10A. Each layer of set L02 is shown with four regions: three wall regions R02, R04, R06 at each of outer positive contour W06 and two inner negative contours W02, W04, as well as a dense or solid fill region. Layer set L02 includes successive layers of "floor" following the number of floors set as a parameter, and may be "solid" filled (e.g., having a toolpath for unreinforced material or plastic that fills in the entire layer, either by tight raster/ox row fills or offsets).

Layer set L04.1 is generated by various rules, and includes, but is not limited to, six regions in each layer: the three wall regions R02, R04, R06 of lower layer set L02 reproduced and/or extended, a sparse fill region of triangular cells R10, and a fiber concentric fill region R08. The concentric fill region R08 as a "fiber fill" would be generated after the walls R02, R04, and R06, but before the sparse fill region R10 (e.g., per steps S8562-8560 of FIG. 9). As shown in FIGS. 11A-11C, the concentric fill rule observes the precedence of the wall or shell rule (e.g., contour walls are 3 shells thick, as set and recorded by default or by parameter entry similar to FIG. 10), and generates three successive offsets (per, e.g., parameter P06 of FIG. 10). As discussed herein, a "rule" may take the form of a subroutine, class, object, script, state machine, or other executable code; and/or of a set of sequential primitive operations. Crossover toolpaths TP06 are shown in an exemplary default position. Three fiber layers are set as parameter P06 in FIG. 10 (from an exemplary available 1-10, but fiber layers may be set up to and including the entire set of layers).

Layer set L04.2 is similar to layer set L04.1 (may be identical, or may be complementary). The operation of a sandwich panel rule as set by parameter P12 in FIG. 10 creates two layers sets L04.1 and L04.2 separated by a sparse infill layer set L06. A sandwich panel rule or fill may be considered a special case or combination of other fills, under operation of a combination rule. In the case of sandwich panel fill, two sets of multi-layer fiber fills (such as concentric, ox-row or ox-row in four 45-45-45-45 angled layers) are separated in the direction of printing. Between these two sets, a cell-based infill provides a web connecting the strong layers. Different processes may be used to arrange the sandwich panel. In one embodiment, a rectangular prism nucleus is expanded to fill the interior space available (e.g., until abutting exterior shells/walls, floors, and or/roofs), and at least one top and bottom layers of the prism are fiber filled with the selected fiber pattern (e.g., concentric, ox-row or 4 layers of ox-row at 45-45-45-45 angles), with the intervening layers being filled with a cellular infill (optionally with fiber cellular infill, as discussed herein). In another embodiment, a start layer having a substantial interior region is filled with fiber (e.g., a layer adjacent a floor or roof occupying more than 50% of the layer area, or a layer having the greatest area), and if the substantial interior region is repeated in parallel for a certain number of layers (e.g., 100 layers), then the sparse polymer infill is again filled.

The sandwich panel rule set by parameter P12 is shown in combination in FIGS. 110, 11A-11C with the concentric fill rule, and operation of other rules are complementary. In some cases, the additional rule will act as a parameter of the sandwich panel rule and change the operation of that rule. For example, if parameter P11 is set to ox-row fill, the fill in layers L04.1 and L04.2 may be carried out in a tight "raster" pattern as discussed in U.S. Pat. No. 6,934,600, but would remain several layers with fiber fill L04.2 separated by many more sparse infill layers L06 from another set of complementary layers L04.1 to complete a part particularly strong in bending because of the increase effective moment of inertia of the sandwich panel form. In other cases, the additional rule would operate separately in a predetermined priority or order of operation. For example, when the "reinforce through holes" rule of parameter P14 is set, either or both of the holes through torque transmitting feature F02 and slip fit feature F04 would be surrounded and reinforced by generating offsets about higher priority protected regions, extending from top to bottom (L02 . . . L10), as modified by other parameters. FIG. 17C shows a reinforced through hole of this type, although in the case of FIG. 17C the hole is reinforced by a region extrusion operation rather than a global rule.

In addition, the sandwich panel rule or fill may incorporate shells in the manner shown and describe with respect to FIGS. 19D-19G, in part or in whole, and embedded within a part or extending to the outer shell. The structure of FIG. 19E may be created with the operation of a sandwich panel rule in which, similar to layers L04.1, L04.2, and L05, concentric fill creates offsets from the outermost protected region (in the case of FIG. 19E, without an outermost protected unreinforced resin wall). The structure of FIGS. 19F and 19G may be created with the operation of a sandwich panel rule in the case of FIG. 19F in which the concentric fill is set to a higher number of fiber shells toward the perimeter of the (e.g., twice as many as outer layers on the centroid side, which could be carried out herein at least as a global rule, a region edit, a layer edit, or a dropped library object), or in the case of FIG. 19G in which a higher number of fiber layers is set.

Continuing with FIGS. 11A-11C, Layer set L06 is generated by a roof parameter variation which specifies that additional walls L06B must be surround the inner and outermost walls of outer and inner contour walls regions L06A, in order to provide anchor points for the solid or dense fill in the lowermost roof region (in this case, the initially formed anchor walls may be overrun by the toolpath of the sparse fill to provide the anchor). Layer set L06 is generated by a roof rule similar to the floor rule of layer set L02, and layer set L10 completes the torque transmitting feature F02 and slip fit feature F04 with dense fill (e.g., 90 layers at 0.1 mm, for 0.9 cm height).

Any exception fill (e.g., per step S8568 of FIG. 9) would be of second lowest priority and conducted before the remainder sparse infill, optionally with special control parameters. For example, should any interstitial distance between bonded ranks formed between borders of regions R02, R04 and the fiber fill region R08 be smaller than the width of the nominal width of fiber printing, a slower extrusion, higher temperature, slower feed speed, slower curing speed, or the like of pure resin fill may be tuned to inject or deposit fill into the interstitial area before the remainder pattern fill is used to sparsely reinforce the interior. An exemplary interstitial, exception fill is shown as region R16 of FIG. 16. In this situation, changes made to fiber pathing via the tools of FIG. 13 create an interstitial area between a fiber region and negative contour wall region, which is optionally treated as an exception to the sparse infill region R10A.

Accordingly, the operation of the global rule set, in the form of executable code or parameters controlling parameterized executable code, permits automated path generation, and global customizations. As noted, although the global rule set is in one embodiment of lesser priority than path, region, or layer customizations, it may be the first sequential rule set that conducts toolpath generation.

In one embodiment, the per-layer operation rule set and order of operations includes a subset or superset of the global operations shown in FIG. 9, but is essentially similar. The user (or an automated overriding function) may change many of the global rules on a layer by layer basis. Layers are each processed in the order shown in FIG. 9.

FIG. 10B shows an exemplary display for layer rule operations on a view panel 1002, and is again generated by rendering to screen 2D definitions (optionally presented in 3D) of contours, subcontours, and toolpaths, with optional processing for occlusion and showing and hiding particular feature types. An alternative plan view per layer is shown in the view panel 1002, set to the sixth layer (of an exemplary approximately 200 layers). An end user may optionally return to another view (e.g., semi-transparent isometric), but retain the same controls and layer number slider P01.

As an example, a scenario is carried out in FIG. 10B in the per-layer editing method (a combination of pathing customization step S760, which presents different interfaces for implementation of rules, and rule processing and region protection step S854, which processes and protects user changes on a layer by layer basis). A user wishes to directly generate a structure similar to that of FIG. 19F by doubling the amount of fiber reinforcement in an outermost layer, or at least in a layer distant from the centroid, to improve the effective moment of inertia. If roofs and floors are set to be a low number of layers, e.g., five as in FIG. 11A, and the roof and floor global setting is protected versus user edits, then the target layers for direct editing of globally automated operations be in this example layers 6 and 101.

As shown in FIG. 10B, for layer 6 the user has specified 6 fiber shells instead of the 3 fiber shells consistent with the global rules, and moreover has turned off "sparse infill". Accordingly, three additional offsets are generated, and fiber pathed (toolpath TP04B) to follow those offsets and rendered to screen. With reference to FIG. 20, these customizations may be associated with layer 6 and recorded in a rule/parameter database as shown, e.g., "Layer 6—Concentric Rings 6—Fill Pattern off". Additionally or in the alternative, with reference to FIG. 21, the regions created by the change (a larger concentric fiber region R08, as well as a smaller interior region R10, now no longer to be sparsely filled) may be recorded in a file or database as protected versus global operations, i.e., protected subcontours. Note, in the present embodiment, the layer change is not protected versus region or path change by the user.

Additionally as shown in FIG. 10B, the last two offsets generated for fiber fill no longer loop about the hole and interior negative contours. This operation generates a potential exception fill, as well as a potential stress concentration in the fiber cusps on the inboard side of the negative contour. While a smoothing operation may be applied as a global rule, or as a layer rule that may be set per layer, to remove the cusp and stress concentration, for the purpose of this disclosure the cusps will be used as an example for user editing of paths and/or regions.

FIG. 12 is a flow chart in which different types of path rule are executed. As noted, direct editing toolpaths, or heuristic or algorithmic determination of toolpaths, takes precedence in one embodiment. As noted, a path customization that deposits fiber or polymer at a wall, floor, roof, fiber fill region, exception fill region, or area fill region may optionally override the global, layer, or regional rules or settings.

In step S8502, the process of FIG. 9 refers to any recorded direct edits (again, which may be manual or automated operations) that were recorded, and generates the corresponding toolpaths, protecting the region surrounding those toolpaths from region, layer, or global operations. The discussion of FIG. 13 below will describe exemplary direct edits.

Figure 14A:
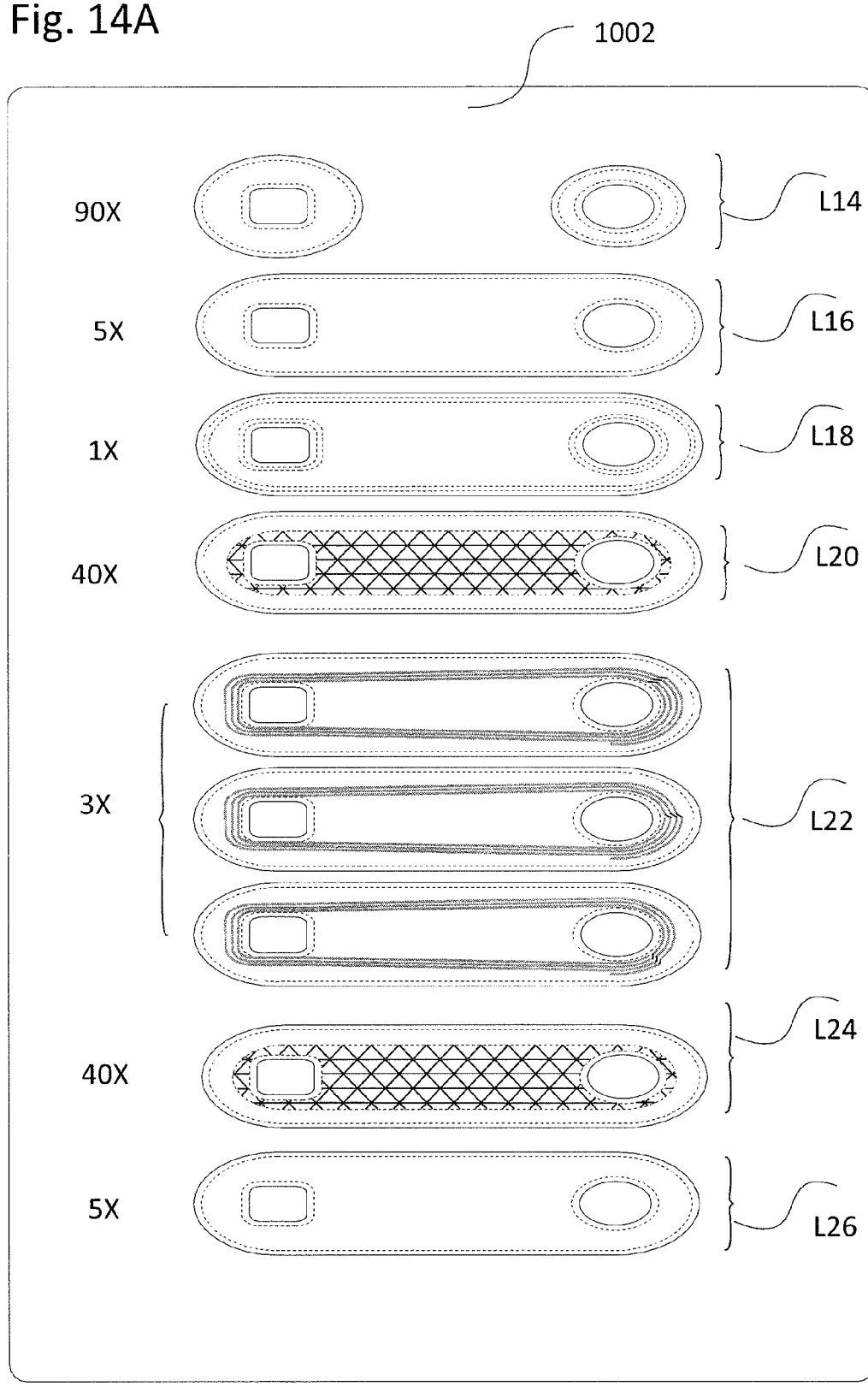
FIGS. 14A-14D show models, renderings, representations of toolpaths, and data structures as carried out by the part rendering and logic structure of FIG. 13, for a crossover movement example.
Figure 14B:
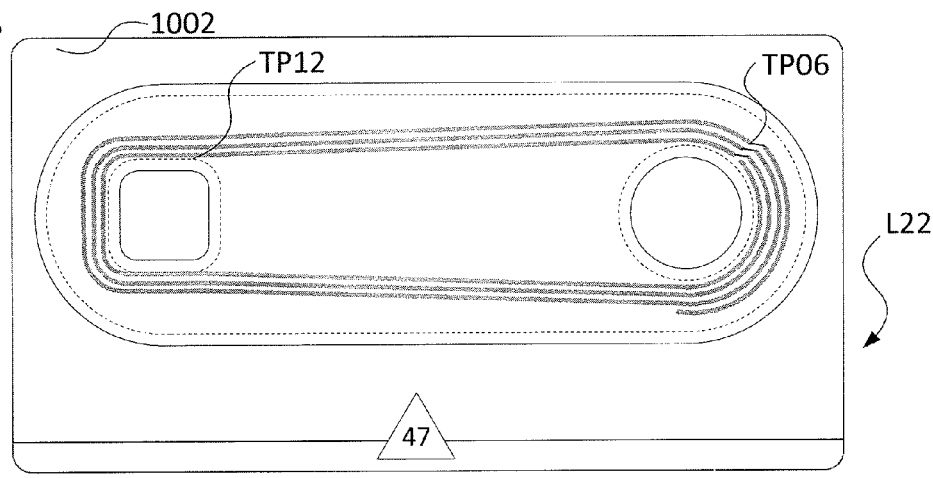
Figure 14C:
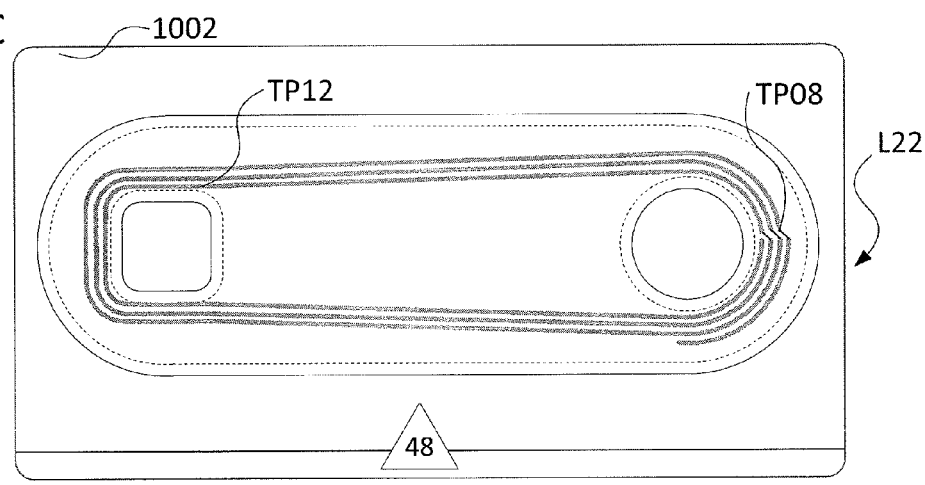
Figure 14D:
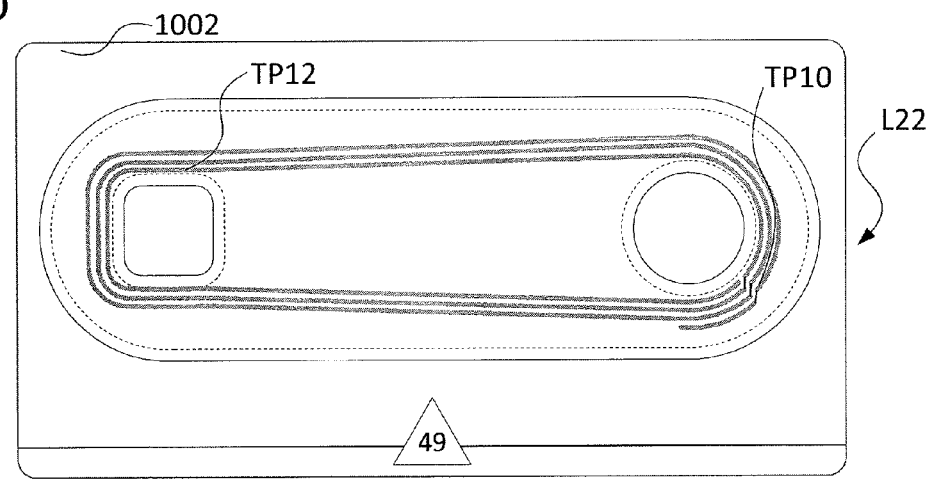

In step S8504, groups of crossovers directed to be shifted, or required to be shifted by operation of heuristic or other rule, are shifted. In this context, as shown in FIGS. 14C-14E, the crossover toolpaths TP06, TP08, TP10 are "shifted" by—even were they placed by global rule in a default position—staggered or relatively migrated about the track of the concentric band. In this manner, stress concentration and/or slight reduction in tensile strength is distributed among layers, rather than stacked up among layers.

In step S8504, groups of crossovers directed to be shifted, or required to be shifted by operation of heuristic or other rule, are shifted. In this context, as shown in FIGS. 14C-14E, the crossover toolpaths TP06, TP08, TP10 are "shifted" by being staggered or relatively migrated about the track of the concentric band. In this manner, stress concentration and/or slight reduction in tensile strength is distributed among layers, rather than stacked up among layers. As a layer operation, the shifting of crossovers may override crossovers placed by global rule in a default or enabling position (e.g., as shown in FIG. 13 at location TP0, in a location that permits the continuous fiber to remain an uncut track).

In step S8504, groups of crossovers directed to be placed on curves, or required to be placed on curves by operation of heuristic or other rule, are so pathed. In this context, as shown in FIGS. 14C-14E, the crossover toolpaths TP06, TP08, TP10 are located on a curve rather than on a straight section. In general, straight sections may be intended to bear tension or compression load, and placement of crossovers on a curve, minimizes the stress concentration and nominally lower strength along the fiber. As shown in FIGS. 14C-14E, the curve connects the straightaways and may be a superior location for the crossovers. The placement of crossovers on curves is by example a path operation, but may be a global, layer or region operation.

Figure 13:
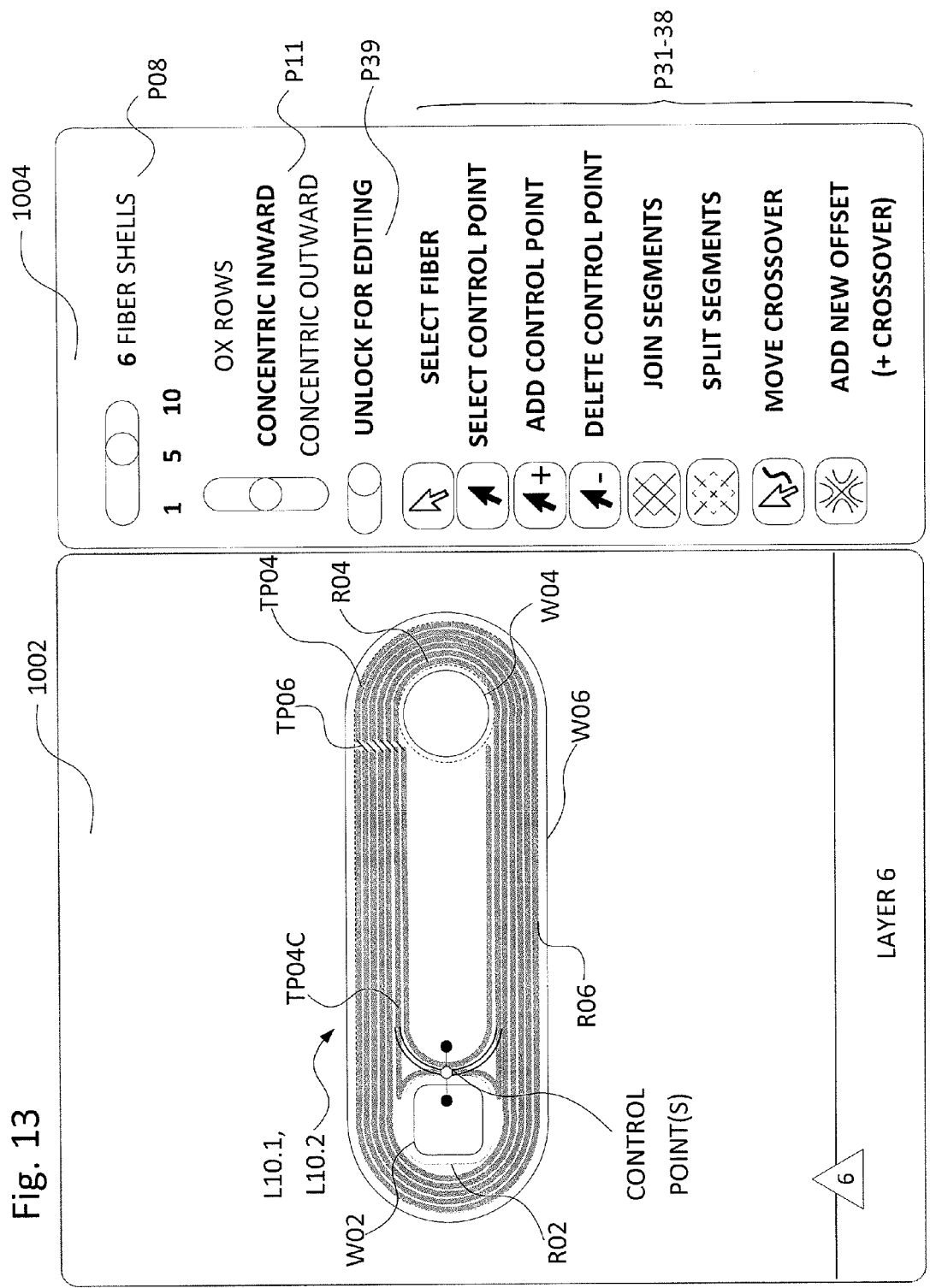
FIG. 13 shows an exemplary on-screen part rendering and logic structure for the rule processing of FIG. 12.

FIG. 13 shows an exemplary on-screen part rendering and logic structure for the rule processing of FIG. 12. Parameters for crossover migration or placement are not shown, but could be available in this structure. The view panel 1002 includes an on-screen rendering of a target layer of the geometry file retained in memory or other database. The selection panel 1004 includes a set of user interface elements that correspond to command flags, arrays, and lists stored in memory or other database (e.g., as shown in FIGS. 20 and/or 21).

Exemplary tools and rules that control path planning for the current layer are available to the path planner, to a display renderer for the view panel 1002 and to a controls renderer for the selection panel 1004, are as shown in the view panel 1004. Numbering for features rendered in the view panel 1004 may reference any of FIG. 13 (display), FIG. 12 (process control), FIG. 20 (rule sets), and/or FIG. 21 (data structures), each inter-related as the data structures defining the operations and the part are created and changed by process control according to rule sets and priorities, and the results of the changes displayed to the user.

As shown in FIG. 13, at the pathing level, the user may choose a subset of the same changes available at the layer level (e.g., the number of shells or the pathing strategy). A set of direct editing tools are available, and the implementation thereof via mouse or touch driven interface connected to record selections and move graphical indicia representative of screen location would be understood by one of ordinary skill in the art. A lock for editing permits the user some protection from inadvertent edits, although an undo function is operative for FIG. 13 and would also help. The toolset includes (i) a fiber selection cursor, for choosing one or more entire trajectories, segments, or toolpaths (ii) control point selection, addition, and deletion cursor, for selecting, moving, adding, and deleting control points of fiber trajectories/toolpaths rendered in FIG. 13 as NURBS or Bezier curves (iii) segment joining and splitting cursors, for combining and splitting toolpaths (especially should heuristic or algorithmic path generation at the global, layer, or regional level be an obstacle to the designer's intent) (iv) a move crossover cursor, for selecting and moving a group of related (i.e., adjacent to one another in parallel offsets) crossovers, e.g., along the track or to a curved portion of the track as discussed herein, and (v) an add new offset cursor, which will generate a new offset from a selected trajectory or toolpath, and fill the offset with a reinforced fiber toolpath (adding a crossover as necessary).

Again, as with FIG. 10B, an example scenario is carried out in FIG. 13 in the per-path editing method, a combination of pathing customization step S760, which presents the interface of FIG. 13 for the implementation of toolpath-level rules, and rule processing and region protection step S850, which processes and protects user changes on a toolpath-by-toolpath basis). A user wishes to directly remove the cusps generated in the explanation of FIG. 10B, continuing the design intent to implement a structure similar to that of FIG. 19F.

As shown in FIG. 13, for layer 6 the user has used the control point cursor to select the innermost fiber loop, and has already deleted control points to render a semicircle instead of the cusps. This edit is complete. As shown, the user has used the control point cursor to activate a ghost loop having NURBS or Bezier control points, and has plotted a curved, lesser stress path (outlined as a dual line ghost path). Upon execution of this design, the new toolpaths are recorded and protected versus coarser changes. Accordingly, one complex fiber toolpath is repathed (toolpath TP04B) to follow the new path and be rendered to screen. With reference to FIG. 20, these customizations may be associated with layer 6 and recorded in a rule/parameter database e.g., "Toolpath #150—trajectory data". Additionally or in the alternative, with reference to FIG. 21, the regions created by the change (a changed concentric fiber region R08, as well as a yet smaller interior region R10) may be recorded in a file or database as regions protected versus global operations as well as layer operations and region operations.

FIGS. 14B-14E show both exemplary rules S8504 and S8506 of FIG. 12 in operation (together). As defined in a data structure and rendered in FIGS. 14B-14E, beginning at the first printing surface, a layer set L26 of "floor" layers includes multiple slices each shown with four regions, substantially similar to layers 1-5 of FIG. 11A. Layer set L24 is a stack of sparse infill and walls, with a particularly thick wall (in many cases, the sparse infill could extend to the outer wall).

Layer set L22 is generated by various rules, and includes, but is not limited to, six regions in each layer: the three wall regions (similar to R02, R04, R06 of FIGS. 11A-11C), a fiber reinforced composite concentric outward fill region having a fiber reinforced fill TP12, and two remainder regions (i.e., area fills per FIG. 9), which are inside and outside of the fiber concentric outward fill region. The concentric outward fill surrounds an envelope extending between the two hole features. As discussed, by operation of S8504 and S8506 of FIG. 12, the group of three offsets TP06, TP08 and TP10 in three adjacent layers are both staggered with respect to one another, and concentrated in a curved section. The remaining layers are similar to layers already discussed herein.

Accordingly, the operation of the toolpath level rule set, in the form of executable code or parameters controlling parameterized executable code, permits semi-automated toolpath customizations. As noted, although the toolpath rule set is in one embodiment of higher priority over region, layer or global customizations, this priority may be otherwise arranged.

Figure 15:
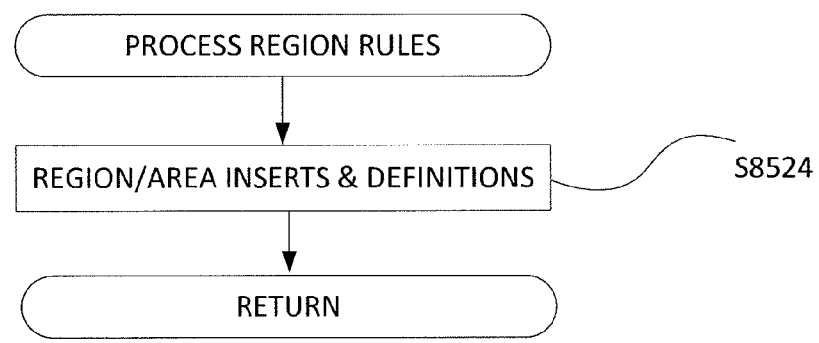
FIG. 15 is a flow chart describing processing of region rules in FIG. 8.

FIG. 15 is a flow chart in which different types of region rule are executed. In one embodiment, direct editing toolpaths, or heuristic or algorithmic determination of toolpaths, takes precedence over the region rules.

In step S8524, the process of FIG. 15 refers to any recorded direct region edits (again, which may be manual or automated operations) that were recorded, and generates the corresponding toolpaths, protecting the region surrounding those toolpaths from layer or global operations. The discussion of FIG. 16 below will describe exemplary direct edits.

Figure 16:
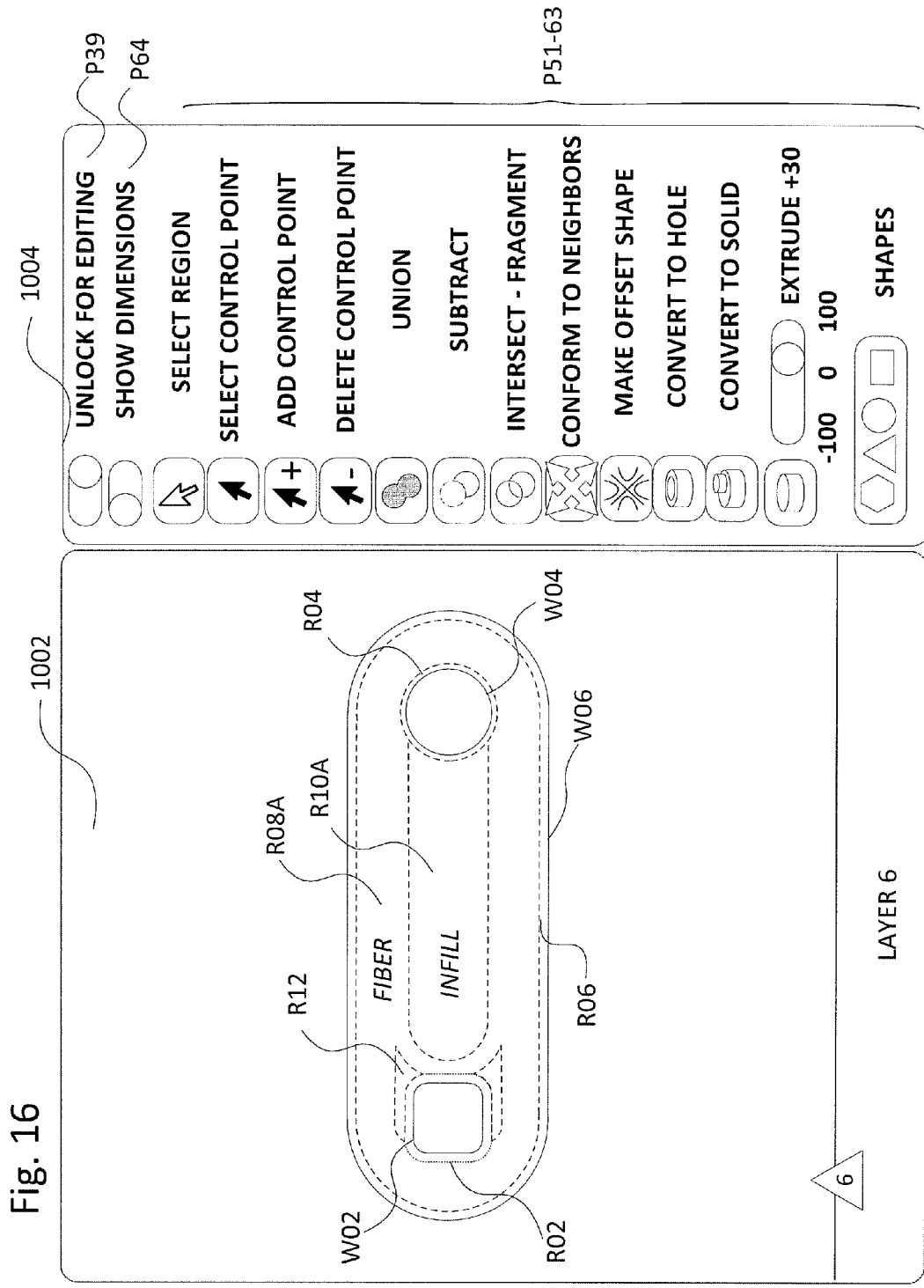
FIG. 16 shows an exemplary on-screen part rendering and logic structure for the rule processing of FIG. 15.

FIG. 16 shows an exemplary on-screen part rendering and logic structure for the rule processing of FIG. 15. Parameters for global or layer fill rules applicable to regions are not shown, but could be available in this structure. The view panel 1002 includes an on-screen rendering of a target layer and target regions of the geometry file retained in memory or other database. The selection panel 1004 includes a set of user interface elements that correspond to command flags, arrays, and lists stored in memory or other database (e.g., as shown in FIGS. 20 and/or 21).

Exemplary tools and rules that control region generation and planning for the current layer and current regions are available to the path planner, to a display renderer for the view panel 1002 and to a controls renderer for the selection panel 1004, are as shown in the view panel 1004. Numbering for features rendered in the view panel 1004 may reference any of FIG. 16 (display), FIG. 15 (process control), FIG. 20 (rule sets), and/or FIG. 21 (data structures), each inter-related as the data structures defining the operations and the part are created and changed by process control according to rule sets and priorities, and the results of the changes displayed to the user.

At the region level, the user may choose a subset of the same changes available at the layer level (e.g., the number of shells or the pathing strategy), although this is not shown in FIG. 16. A set of direct editing tools are available, as with FIG. 13 the implementation thereof via mouse or touch driven interface as understood by one of ordinary skill in the art, with a functionally similar lock for editing and an undo function. The toolset includes (i) a region selection cursor, for choosing one or more entire regions, (ii) control point selection, addition, and deletion cursor, for selecting, moving, adding, and deleting control points of region contours rendered in FIG. 16 as NURBS or Bezier curves (iii) Boolean region joining and splitting operators, for combining and splitting regions selected with the selection cursor (again, especially should heuristic or algorithmic region generation at the global, layer, or regional level be an obstacle to the designer's intent) (iv) a conform to neighbor operator, for incrementally expanding a region boundary to fully conform to neighboring regions, to avoid, e.g., gaps, overlaps, non-watertight, and/or non-manifold errors in creation of regions, (v) a make offset shape operator, for creating a new region that is an offset of an existing region (a dialog may ask how wide the offset should be), (vi) a convert to hole operator, for converting a region into a negative contour, (vii) a convert to solid operator, for converting a region into a solid and/or positive contour (viii) an extrude operator, for replicating a region up or down a specified number of layers, inclusive, and (vii) a shape primitive operator, for creating primitive shapes that may be combined with one another or with existing regions using the Boolean region tools.

Toolpath appearance has been hidden in FIG. 16 for the sake of explanation and visibility of regions, but operation of the region direct editing tools would include the ability to show or hide toolpaths within the regions, regenerate such toolpaths, select new toolpath rules (e.g., change the fill type of a region). For example, upon creation of a shape, solid, or a Boolean operation between dissimilar filled shapes, the user would be required to specify a fill (solid, sparse infill, or fiber infill; of whatever type).

The extrusion operator, as a region level tool, takes precedence over layer and global rules, but not over paths. In other words, a region extruded from a present layer in the region editing mode will "punch through" global or layer defaults, but will not "punch through" a user-tuned toolpath. While shown with a range slider control from −100 to +100 layers from the present layer, the extrusion operator would permit extrusion to all layers (as with all slider controls disclosed herein, by direct entry or otherwise, e.g., by continuing to increment or decrement at the end of the slider range). One example use of the extrusion tool is to extend a particular fiber toolpath design or complex sparse in-fill region internally within the part. Another is to create a new solid feature or hole. For example, a solid infill (by default) hexagon shape may be created with the shape tool, placed in a desired position according to its displayed size and location from contours of the part (e.g., "show dimensions" toggle "on" or measureable with a measuring tool), extruded through the part, then punched through with the convert to hole operator. It should be noted that automatically created regions can be, of course, operated on in the region editing window. For example, a protected boundary region created by a customized toolpath design using the toolset and rules of FIG. 13 would be available for editing, replication, or extrusion in the end-user interface of FIG. 16 or otherwise to programmatic operation. In such cases, where a higher priority toolpath-surrounding, toolpath-generated, and/or toolpath level protected region is edited, the end-user may receive a dialog or other warning and authorize editing, extruding, or replicating of the protected toolpath-region.

Again, as with FIGS. 10B and 13, an example scenario is carried out in FIG. 16 in the per-region editing method, a combination of pathing customization step S760, which presents the interface of FIG. 16 for the implementation of region-level rules, and rule processing and region protection step S852, which processes and protects user changes on a region-by-region basis. In this scenario, user wishes to designate and propagate a small area as an exceptional fill.

As shown in FIG. 16, for layer 6 the user may use the select region cursor to select two small remainder regions R12, which absent algorithmic detection or user intervention will be filled with the same area infill of region R10A. In the described scenario, remainder regions R12 were created as cutouts from the expansion and subsequent manual rerouting of carbon concentric fill, creating and modifying region R08A. After selecting both regions R12 (e.g., with conventional mouse or touch multi-object selection techniques), the user may extrude them up and down to the extent they will fill in poorly with area fill, then convert to solid, where upon the user will be given a choice of fill—and would select either solid fill or a dense fill for such exceptions. Accordingly, the exceptional regions would be printed with solid fill rather than a poor infill. In this particular case, the user's edit of region content changes the automatic area infill such that torque transmitting feature F02 is reinforced along two polygonal sides to transmit force through solid polymer to the concentric fiber fill surrounding it.

Figure 17B:
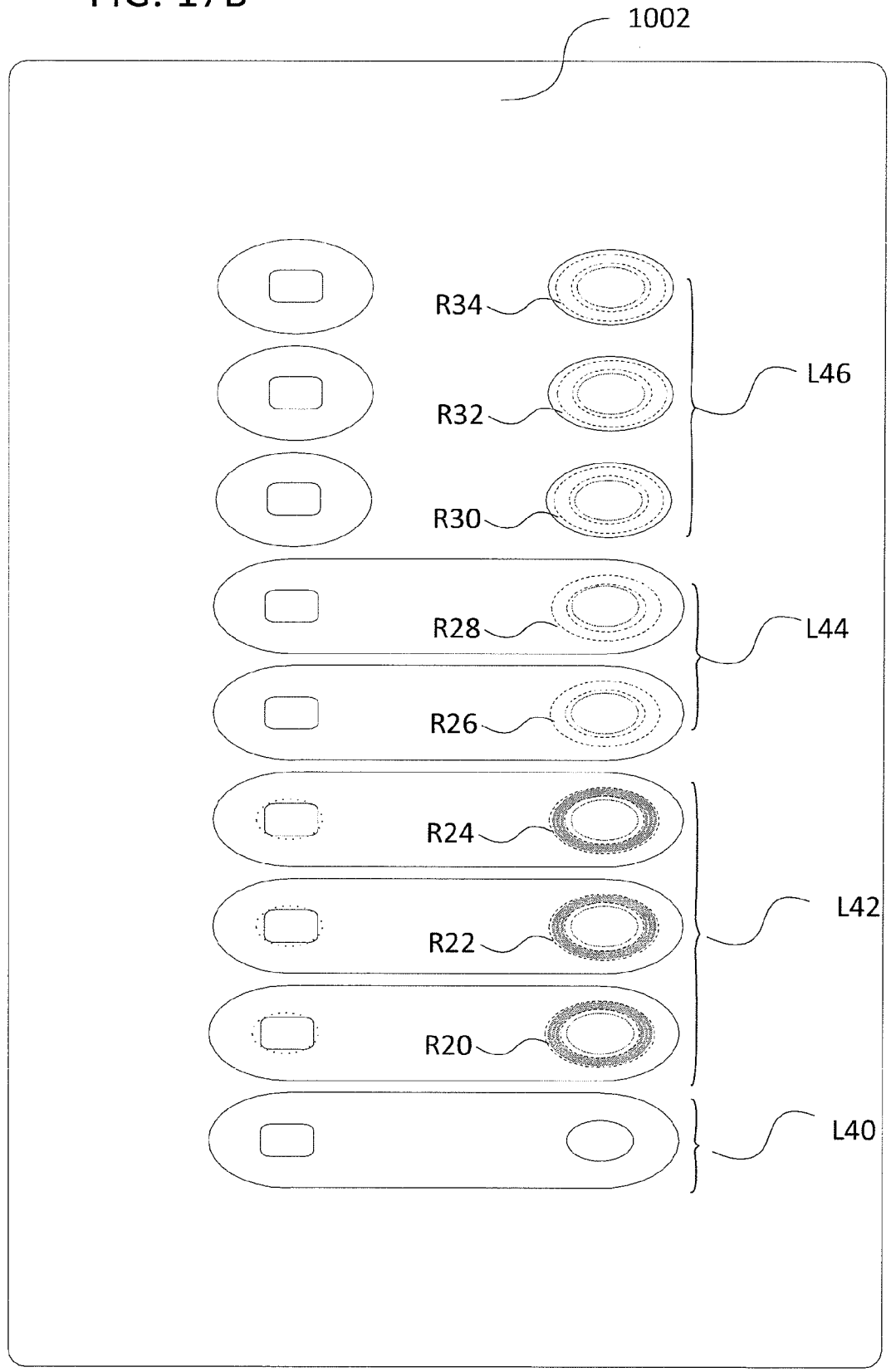
Figure 17C:
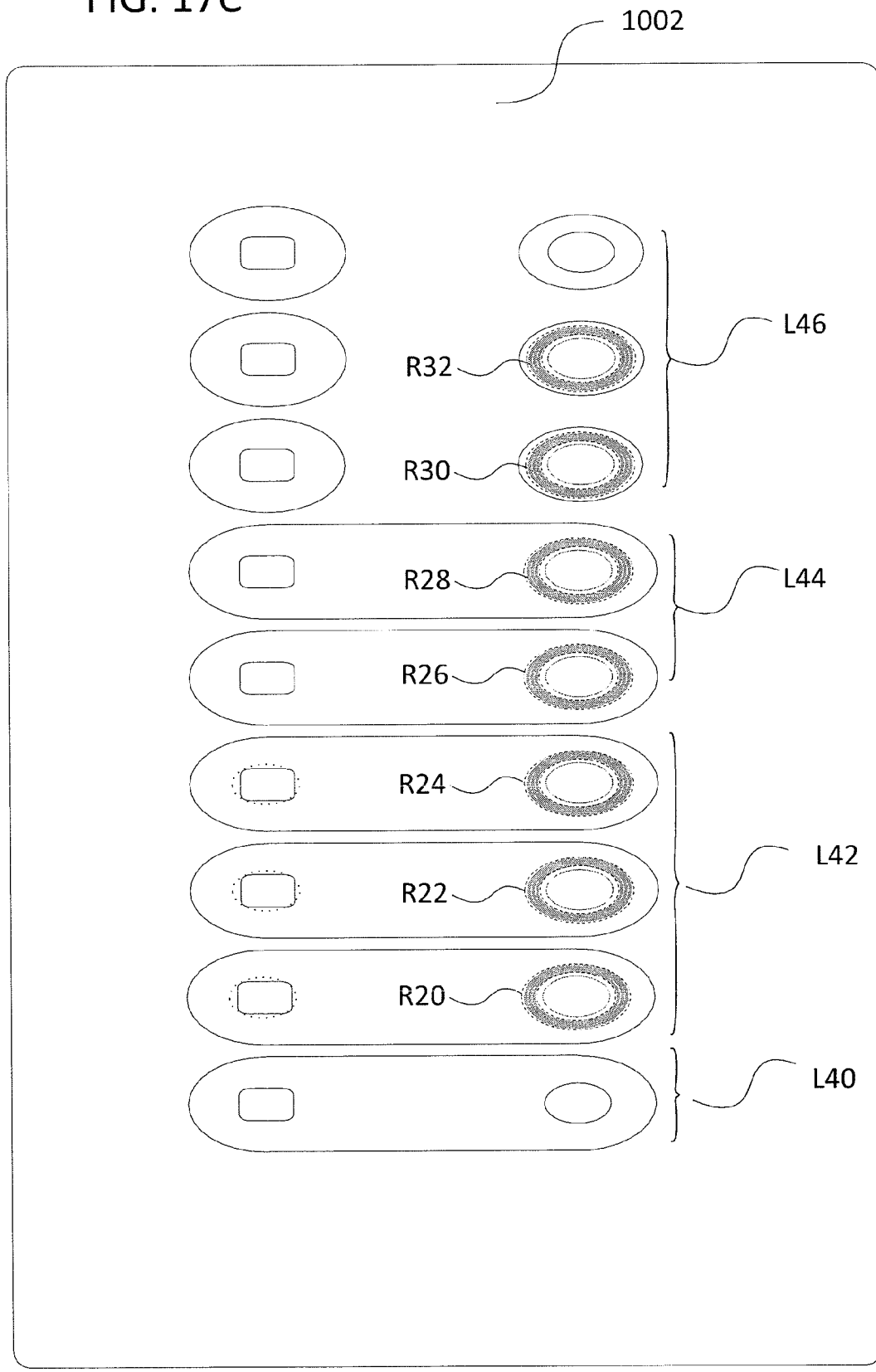

FIGS. 17A-17C show a second exemplary region select and extrude operation per FIGS. 15 and 16. As defined in a data structure and rendered in FIGS. 17A-17C, beginning at the first printing surface, a layer set L40 of "floor" layer includes one representative slice (although more floors would be used in practice, this layer is not used in the example). By prior operation—for example a layer rule and/or, a toolpath rule and/or edit, or a prior region rule and/or edit, layer set L42 includes three regions R20, R22, R24 having concentric hole reinforcement, extending through three layers.

Using the tools of FIG. 16 and the operations of the processes of FIG. 15, the user sets the current layer to the top layer of layer set L42, and selects the region R25 with the region selection tool. The region is extruded, using the region extrusion operator, up five layers, through layer sets L44 (roof layers of similar contour) and L46 (circular mounts of much smaller contour). Should the region R24 not extrude well into the smaller contour, it can be shaped using the tools and operators. For the present example, the region R24 replicates unchanged in form as an extrusion, now regions R26-34. The user receives a warning that a global rule is in conflict (i.e., a global rule requirement of a roof in the topmost layer of the part, of layer set L46), and declines to overrule the global rule. Having committed the extrusion, the user is prompted with a choice of fills (e.g., selectable from (i) the same identical fill as the parent region, (ii) a newly pathed fill of the same type as the parent region, or (iii) a new fill of any compatible type). The user selects identical fill, which is propagated (contingent on any overriding global rules) to the penultimate layer of layer set L46, as shown in FIG. 17C.

Accordingly, the operation of the region level rule set, in the form of executable code or parameters controlling parameterized executable code, permits automated region generation, and region customizations. As noted, although the region rule set is in one embodiment of lesser priority than path, but greater priority than layer or global customizations, this priority may be otherwise arranged.

The methods described herein as carried out by path planner or printer may form three dimensional shells over the outer contour of a stack of two dimensional layers. This may prevent delamination and increase torsional rigidity of the part. In this case, the print heads and/or deposition heads (including optical or radiative curing) of FIGS. 1A-1C and 2A-2C may articulate, and or deposit, in one to three rotational degrees of freedom in addition to the three translation degrees of freedom; and the path planner may generate paths in space corresponding to these additional degrees of freedom.

Figure 19A:
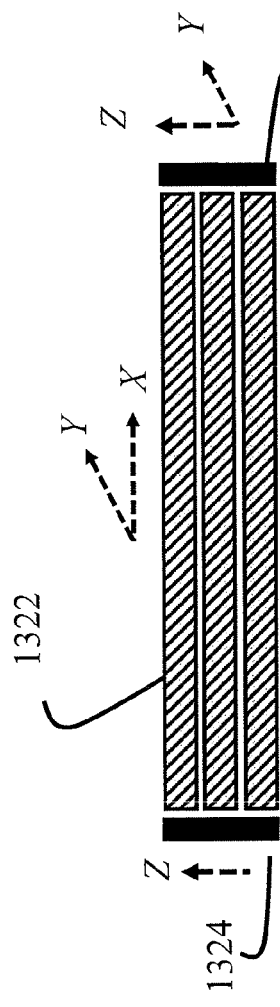
FIGS. 19A-19C show exemplary six-axis shell layup in contrasting directions.
Figure 19B:
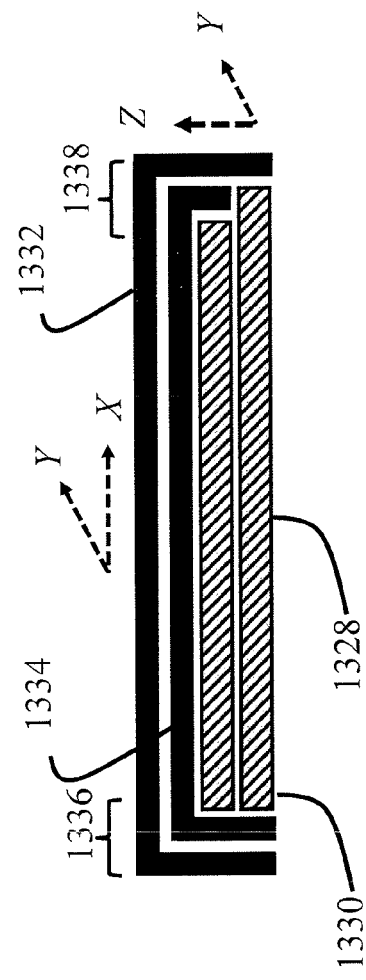
Figure 19C:
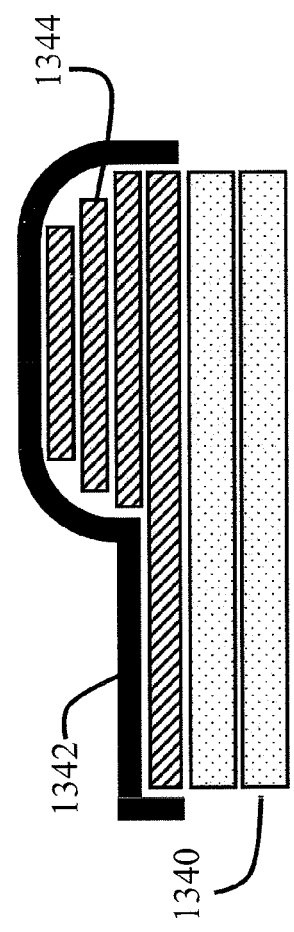

FIGS. 19A-19C depict various parts formed using the printer head depicted in FIGS. 1A-1C and 2A-2C. FIG. 19A shows a part including a plurality of sections 1322 deposited as two dimensional layers in the XY plane. Sections 1324 and 1326 are subsequently deposited in the ZY plane to give the part increased strength in the Z direction. FIG. 19B show a related method of shell printing, where layers 1328 and 1330 are formed in the XY plane and are overlaid with shells 1332 and 1334 which extend in both the XY and ZY planes. As depicted in the figure, the shells 1332 and 1334 may either completely overlap the underlying core formed from layers 1328 and 1330, see portion 1336, or one or more of the shells may only overly a portion of the underlying core. For example, in portion 1338 shell 1332 overlies both layers 1328 and 1330. However, shell 1334 does not completely overlap the layer 1328 and creates a stepped construction as depicted in the figure. FIG. 19C shows an alternative embodiment where a support material 1340 is added to raise the part relative to a build platen, or other supporting surface, such that the pivoting head of the three dimensional printer has clearance between the part and the supporting surface to enable the deposition of the shell 1342 onto the underlying layers 1344 of the part core.

The above described printer head may also be used to form a part with discrete subsections including different orientations of a continuous core reinforced filament. The orientation of the continuous core reinforced filament in one subsection may be substantially in the XY direction, while the direction in another subsection may be in the XZ or YZ direction.

The path planning and printing processes may utilize a fill pattern that uses high-strength composite material in selected areas and filler material (e.g., less strong composite or pure resin such as nylon) in other locations, see FIGS. 19D-19G, which depict stacks of layers in cross section. As discussed with reference to the sandwich panel global or region rule, in some cases, reinforcement is conducted by identifying an internal volume or volumes in the shape of simplified beams or panel, e.g., an interior prism or volume spanning and extending beyond bending load and/or support points. In addition, the part may be oriented during planning for deposition such that layers within the volume span the anticipated load and/or support points. Fiber may be fiber added within the interior prism volume remote from a centroid of a cross section of the volume, to increase effective moment of inertia (particularly for bending or compression loads). Fibers may be deposited in multiple adjacent bonded ranks and/or layers, to increase fiber rank interaction and reinforcement of neighbors (particularly for compression and tension loads). Through holes or mounts through which or into which load members are expected to be inserted may each be smoothly looped by fiber, optionally directly at the wall of such mount (particularly for tension and torsion loads, looping may permit fewer stress concentrations and the transmission of tension through smooth paths).

Figure 19D:
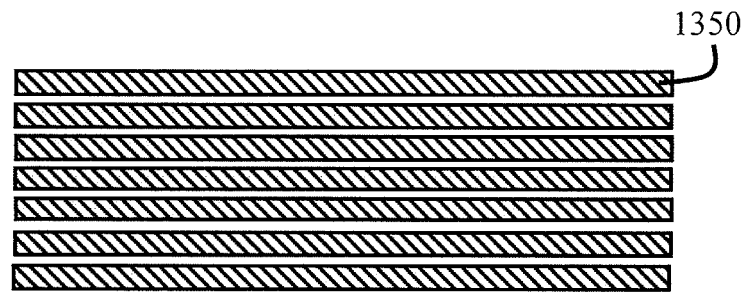
FIG. 19D-19G show exemplary weighted distribution of composite lay-up according to the present embodiments to increase effective moment of inertia.
Figure 19E:
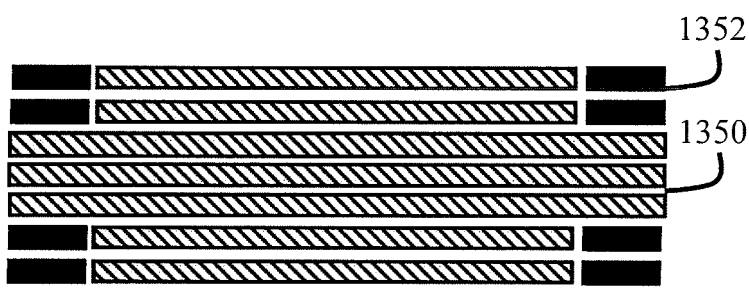
Figure 19F:
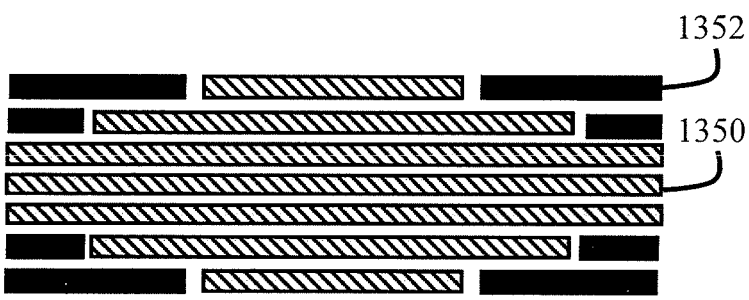
Figure 19G:
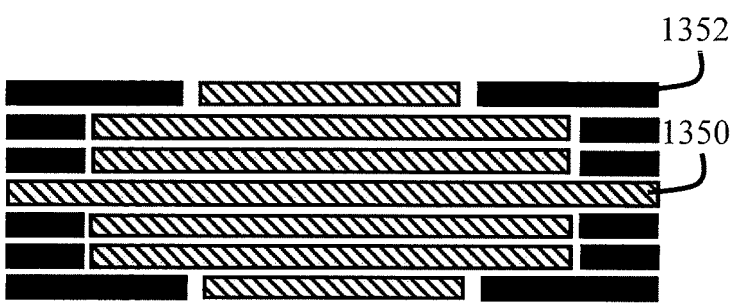

Especially for beam and panel bending, the strength to weight performance of a beam is optimized by placing fiber ranks as far as possible (i.e., at the farthest position both within the part and that does not violating any higher priority rules in effect at the boundary of the part) from the centroid of a cross-section to increase effective moment of inertia. A part formed completely from the fill material 1350 is depicted in FIG. 19D. In FIG. 19E, a composite material 1352 is deposited at the radially outward most portions of the part and extending inwards for a desired distance to provide a desired increase in stiffness and strength. The remaining portion of the part is formed with the fill material 1350. A user may extend the use of composite versus filler either more or less from the various corners of the part as illustrated by the series of figures FIGS. 19D-19G. For example, a control algorithm controlled by controller 20 may use a concentric fill pattern that traces the outside corners and wall sections of the part, for a specified number of concentric infill passes, the remainder of the part may then be filled using a desired fill material.

What is claimed is:

1. A machine implemented method for generating three-dimensional toolpath signals for controlling a three dimensional printer, the method comprising:
   receiving a three-dimensional geometry;
   slicing the three-dimensional geometry into a plurality of layers;
   generating an isotropic fill material toolpath signal for controlling the three dimensional printer to deposit a substantially isotropic fill material along an isotropic fill toolpath, wherein the generated isotropic toolpath signal defines at least part of a perimeter of a first layer of the plurality of layers;
   generating a first anisotropic fill material toolpath signal for controlling the three dimensional printer to deposit a substantially anisotropic fill material along a first anisotropic fill toolpath, wherein an anisotropic characteristic of the substantially anisotropic fill material is oriented relative to a trajectory of the first anisotropic fill toolpath, and wherein the generated first anisotropic toolpath signal defines at least part of an interior of the first layer of the plurality of layers; and
   transmitting motion command signals corresponding to the isotropic fill material toolpath signal and the first anisotropic fill material toolpath signal to the three dimensional printer, the option command signals configured to control the three dimensional printer to print a 3D printed part by:
      depositing the substantially isotropic fill material along the isotropic fill toolpath to define the at least part of the perimeter of the first layer;
      depositing the substantially anisotropic fill material along the first anisotropic fill toolpath to define the at least part of the interior of the first layer; and
      orienting the anisotropic characteristic of the substantially anisotropic fill material to follow the trajectory of the first anisotropic fill toolpath such that the first layer of the 3D printed part exhibits the anisotropic characteristic in a specific direction corresponding to the trajectory of the first anisotropic fill toolpath.

2. The method according to claim 1, wherein generating the first anisotropic fill material toolpath signal further comprises:
   generating the first anisotropic fill material toolpath signal for controlling the three dimensional printer to deposit the substantially anisotropic fill material in a location adjacent to and reinforcing a negative subcontour within the interior of the first layer.

3. The method according to claim 1, wherein generating the first anisotropic fill material toolpath signal further comprises:
   generating a second anisotropic fill material toolpath signal for controlling the three dimensional printer to deposit the substantially anisotropic fill material along a second anisotropic fill toolpath, the second anisotropic fill material toolpath signal being computed based on the first anisotropic fill material toolpath signal and configured to control the three dimensional printer to deposit the substantially anisotropic fill material in a location adjacent to and reinforcing the first anisotropic fill toolpath of the first layer.

4. The method according to claim 3, wherein the second anisotropic fill toolpath is located within the first layer.

5. The method according to claim 3, wherein the second anisotropic fill toolpath is located within a second layer of the plurality of layers, the second layer adjacent to the first layer.

6. The method according to claim 5, wherein the generated first anisotropic fill material toolpath signal defines at least part of the interior of the first layer and includes a first start point, and wherein the generated second anisotropic fill material toolpath signal defines at least part of an interior of the second layer, and includes a second start point offset from the first start point.

7. The method according to claim 5, wherein the generated first anisotropic fill material toolpath signal defines at least part of the interior of the first layer and includes a first crossover to an adjacent portion of the first anisotropic fill toolpath, and wherein the generated second anisotropic fill material toolpath signal defines at least part of an interior of the second layer, and includes a second crossover to an adjacent portion of the second anisotropic fill toolpath, the second crossover being offset from the first crossover.

8. The method according to claim 1, wherein generating the first anisotropic fill material toolpath signal further comprises:
   generating a second anisotropic fill material toolpath signal for controlling the three dimensional printer to deposit the substantially anisotropic fill material along a second anisotropic fill toolpath, the second anisotropic fill material toolpath, signal being computed based on the first anisotropic fill material toolpath signal and the first and second anisotropic fill toolpaths establishing a centroid therebetween;
   wherein the isotropic fill toolpath is proximate the centroid and defines at least part of a perimeter and at least part of an interior of a third layer of the plurality of layers, the third layer intervening between the first layer and a second layer of the plurality of layers.

9. The method according to claim 1, wherein generating the first anisotropic fill material toolpath signal further comprises:
generating the first anisotropic fill toolpath to follow an irregular trajectory including an offset from a compound subcontour boundary.

10. The method according to claim 9, wherein generating the first anisotropic fill material toolpath signal further comprises:
generating a crossover between the offset of the first anisotropic fill toolpath and an offset of a second anisotropic fill toolpath, wherein the crossover is arranged on a curved portion of the first anisotropic fill toolpath.

11. A method for generating three-dimensional toolpath instructions for a three dimensional printer, the method comprising:
receiving a three-dimensional geometry;
slicing the three-dimensional geometry into a plurality of layers;
generating a first anisotropic fill material toolpath signal for controlling the three dimensional printer to deposit a substantially anisotropic fill material along a first anisotropic fill toolpath, wherein an anisotropic characteristic of the substantially anisotropic fill material is oriented relative to a trajectory of the first anisotropic fill toolpath, and wherein the generated first anisotropic fill material toolpath signal defines at least part of an interior of a first layer of the plurality of layers;
generating a second anisotropic fill material toolpath signal for controlling the three dimensional printer to deposit the substantially anisotropic fill material along a second anisotropic fill toolpath, wherein the anisotropic characteristic of the substantially anisotropic fill material is oriented relative to a trajectory of the second anisotropic fill toolpath, and wherein the generated second anisotropic fill material toolpath signal defines at least part of an interior of a second layer of the plurality of layers;
generating an isotropic fill material signal for controlling the three dimensional printer to deposit a substantially isotropic fill material along an isotropic fill toolpath, wherein the generated isotropic fill material toolpath signal defines at least part of a perimeter and at least part of an interior of a third layer of the plurality of layers, the third layer intervening between the first and second layers; and
transmitting motion command signals corresponding to the isotropic fill material toolpath signal, the anisotropic fill material toolpath signal, and the second anisotropic fill material toolpath signal to the three dimensional printer, the motion command signals configured to control the three dimensional printer to print a 3D printed part by:
depositing the substantially isotropic fill material along the isotropic fill toolpath to define the at least part of the perimeter and the at least part of the interior of the third layer;
depositing the substantially anisotropic fill material along the first anisotropic fill toolpath to define the at least part of the interior of the first layer;
depositing the substantially anisotropic fill material along the second anisotropic fill toolpath to define the at least part of the interior of the second layer;
orienting the anisotropic characteristic of the substantially anisotropic fill material to follow the trajectory of the first anisotropic fill toolpath such that the first layer of the 3D printed part exhibits the anisotropic characteristic in a first specific direction corresponding to the trajectory of the first anisotropic fill toolpath; and
orienting the anisotropic characteristic of the substantially anisotropic fill material to follow the trajectory of the second anisotropic fill toolpath such that the second layer of the 3D printed part exhibits the anisotropic characteristic in a second specific direction corresponding to the trajectory of the second anisotropic fill toolpath.

12. The method according to claim 11, further comprising:
generating the second anisotropic fill material toolpath signal based on the first anisotropic fill material signal, wherein the first and second anisotropic fill toolpaths establish a centroid therebetween; and
wherein the isotropic fill toolpath is proximate the centroid.

13. The method according to claim 11, wherein generating the first anisotropic fill material toolpath signal further comprises:
generating the first anisotropic fill material toolpath signal for controlling the three dimensional printer to deposit the substantially anisotropic fill material in a location adjacent to and reinforcing a negative subcontour within the interior of the first layer.

14. The method according to claim 11, wherein generating the first anisotropic fill material toolpath signal further comprises:
generating a third anisotropic fill material toolpath signal for controlling the three dimensional printer to deposit the substantially anisotropic fill material along a third anisotropic fill toolpath, the third anisotropic fill material toolpath signal being computed based on the first anisotropic fill material toolpath signal and being configured to control the three dimensional printer to deposit the substantially anisotropic fill material in a location adjacent to and reinforcing the first anisotropic fill toolpath of the first layer.

15. The method according to claim 14, wherein the third anisotropic fill toolpath is located within the first layer.

16. The method according to claim 14, wherein the third anisotropic fill toolpath is located within the second layer adjacent to the first layer.

17. The method according to claim 11, wherein the generated first anisotropic fill material toolpath signal defines at least part of the interior of the first layer and includes a first start point, and wherein the generated second anisotropic fill material toolpath signal defines at least part of the interior of the second layer, and includes a second start point offset from the first start point.

18. The method according to claim 11, wherein the generated first anisotropic fill material toolpath signal defines at least part of the interior of the first layer and includes a first crossover to an adjacent portion of the first anisotropic fill toolpath, and wherein the generated second anisotropic fill material toolpath signal defines at least part of the interior of the second layer, and includes a second crossover to an adjacent portion of the second anisotropic fill toolpath, the second crossover being offset from the first crossover.

19. The method according to claim 11, wherein generating a first anisotropic fill material toolpath signal further comprises:
   generating the first anisotropic fill toolpath following an irregular trajectory including an offset from a compound subcontour boundary.

20. The method according to claim 19, wherein generating a first anisotropic fill material toolpath signal further comprises:
   generating a crossover between the offset of the first anisotropic fill toolpath and an offset of the second anisotropic fill toolpath, wherein the crossover is arranged on a curved portion of the first anisotropic fill toolpath.

* * * * *